United States Patent
Lee et al.

(10) Patent No.: US 11,430,515 B2
(45) Date of Patent: Aug. 30, 2022

(54) RESISTIVE MEMORY DEVICE CONTROLLING BITLINE VOLTAGE

(71) Applicant: SAMSUNG ELECTRONICS CO., LTD., Suwon-si (KR)

(72) Inventors: Kyunghwan Lee, Seoul (KR); Yongseok Kim, Suwon-si (KR); Cheonan Lee, Yongin-si (KR); Satoru Yamada, Yongin-si (KR); Junhee Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 17/036,004

(22) Filed: Sep. 29, 2020

(65) Prior Publication Data

US 2021/0151101 A1 May 20, 2021

(30) Foreign Application Priority Data

Nov. 14, 2019 (KR) .................. 10-2019-0146180

(51) Int. Cl.
*G11C 13/00* (2006.01)
*H01L 27/24* (2006.01)

(52) U.S. Cl.
CPC ........ *G11C 13/004* (2013.01); *G11C 13/0007* (2013.01); *G11C 13/0026* (2013.01);
(Continued)

(58) Field of Classification Search
None
See application file for complete search history.

(56) References Cited

U.S. PATENT DOCUMENTS

| 7,289,360 B2 | 10/2007 | Guterman et al. |
| 7,755,922 B2 * | 7/2010 | Taguchi ................ G11C 13/00 365/148 |

(Continued)

FOREIGN PATENT DOCUMENTS

| KR | 10-0944322 | 2/2010 |
| KR | 10-1010175 | 1/2011 |
| KR | 10-2015-0021376 | 3/2015 |

OTHER PUBLICATIONS

1st Office Action dated Jun. 24, 2021 in corresponding Application No. DE Patent Application No. 102020122716.7.

*Primary Examiner* — Tri M Hoang
(74) *Attorney, Agent, or Firm* — F. Chau & Associates, LLC

(57) ABSTRACT

A resistive memory device includes a memory cell array, control logic, a voltage generator, and a read-out circuit. The memory cell array includes memory cells connected to bit lines. Each memory cell includes a variable resistance element to store data. The control logic receives a read command and generates a voltage control signal for generating a plurality of read voltages based on the read command. The voltage generator sequentially applies the read voltages to the bit lines based on the voltage control signal. The read-out circuit is connected to the bit lines. The control logic determines values of data stored in the memory cells by controlling the read-out circuit to sequentially compare values of currents sequentially output from the memory cells in response to the plurality of read voltages with a reference current.

20 Claims, 25 Drawing Sheets

(52) U.S. Cl.
CPC ........ *H01L 27/249* (2013.01); *H01L 27/2454* (2013.01); *G11C 2013/0054* (2013.01); *G11C 2213/71* (2013.01); *G11C 2213/75* (2013.01)

(56) References Cited

U.S. PATENT DOCUMENTS

| | | | |
|---|---|---|---|
| 7,885,101 | B2 | 2/2011 | Bedeschi et al. |
| 8,008,286 | B2* | 8/2011 | Lynch .................... A61P 25/00 |
| | | | 514/183 |
| 8,085,615 | B2* | 12/2011 | Taguchi ............. G11C 13/0069 |
| | | | 365/230.06 |
| 8,259,490 | B2 | 9/2012 | Kang et al. |
| 8,427,865 | B2 | 4/2013 | Shima et al. |
| 8,917,556 | B2 | 12/2014 | Kwak |
| 9,042,152 | B2 | 5/2015 | Kim et al. |
| 9,058,874 | B2 | 6/2015 | Choi et al. |
| 9,093,369 | B2 | 7/2015 | Shin et al. |
| 9,412,444 | B2 | 8/2016 | Yi et al. |
| 10,304,542 | B2 | 5/2019 | Lim et al. |
| 2009/0237992 | A1* | 9/2009 | Maejima ............. G11C 11/5642 |
| | | | 365/185.03 |
| 2011/0273927 | A1 | 11/2011 | Hanzana et al. |
| 2016/0358664 | A1 | 12/2016 | Li et al. |
| 2017/0352414 | A1* | 12/2017 | Pellizzer ............ G11C 13/0069 |
| 2018/0301187 | A1* | 10/2018 | Ignowski ............. G11C 13/004 |
| 2020/0294602 | A1* | 9/2020 | Lee ........................ G11C 16/32 |
| 2020/0327921 | A1* | 10/2020 | Takeda .................... G11C 7/12 |

\* cited by examiner

RESISTIVE MEMORY DEVICE CONTROLLING BITLINE VOLTAGE

CROSS-REFERENCE TO RELATED APPLICATION

This U.S. non-provisional patent application claims the benefit of priority under 35 U.S.C. § 119 to Korean Patent Application No. 10-2019-0146180, filed on Nov. 14, 2019, in the Korean Intellectual Property Office, the disclosure of which is incorporated by reference in its entirety herein.

BACKGROUND

1. Technical Field

The inventive concept relates to a memory device, and more particularly, to a resistive memory device.

2. Discussion of Related Art

A resistive memory device such as phase change random-access memory (PRAM), nano floating gate memory (NFGM), polymer random-access memory (PoRAM), magnetic random-access memory (MRAM), ferroelectric random-access memory (FeRAM), resistive random-access memory (RRAM) and flash memory are nonvolatile memory devices. The resistive memory device has nonvolatile characteristics of flash memory, but high-speed characteristics of dynamic random-access memory (DRAM), which is a volatile memory device.

Memory cells of the resistive memory device may have a one of a plurality of different resistances (e.g., program states) according to a value of programmed data. When reading data stored in the memory cells, the value of the programmed data may be sensed by applying a voltage to the memory cell and comparing an output current of the memory cell with a plurality of reference currents. Accordingly, several reference currents need to be generated.

SUMMARY

Embodiment the inventive concept provide a resistive memory device and a method of operating the same that determines a program state by applying a plurality of read voltages to bit lines and comparing the read voltages with one reference voltage.

According to an exemplary embodiment of the inventive concept, there is provided a resistive memory device including a memory cell array, control logic, a voltage generator, and a read-out circuit. The memory cell array includes a plurality of memory cells connected to a plurality of bit lines. Each memory cell include a variable resistance element to store data. The control logic is configured to receive a read command and to generate a voltage control signal for generating a plurality of read voltages, based on the read command. The voltage generator is configured to sequentially apply the plurality of read voltages to the plurality of bit lines, based on the voltage control signal. The read-out circuit is connected to the bit lines. The control logic determines values of data stored in the plurality of memory cells by controlling the read circuit to sequentially compare values of currents sequentially output from the plurality of memory cells in response to the plurality of read voltages with a reference current.

According to an exemplary embodiment of the inventive concept, there is provided a method of operating a resistive memory device including applying a first voltage to a plurality of bit lines of the resistive memory device, sensing a first current from a memory cell array of the resistive memory device in response to the first voltage, determining first memory cells of the memory cell array having a first program state in response to the first voltage by comparing the first sensed current with a reference current, applying a second voltage to the plurality of bit lines, the second voltage being different than the first voltage, sensing a second current from the memory cell array in response to the second voltage, and determining second memory cells having a second program state by comparing the second sensed current with the reference current.

According to an exemplary embodiment of the inventive concept, there is provided a resistive memory device including a memory cell array including a plurality of merged memory cells each including a resistive memory element and a charge trap layer, a control logic that receives a read command and generates a voltage control signal for generating a plurality of read voltages based on the read command, a voltage generator configured to sequentially apply the plurality of read voltages to a plurality of bit lines connected to the merged memory cells based on the voltage control signal, and to apply a gate voltage to the charge trap layer, and a read-out circuit including a first sense amplifier configured to determine a first program state for the resistive memory element and a second sense amplifier configured to determine a second program state for the charge trap layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Hereinafter, exemplary embodiments of the inventive concept will be described in detail with reference to the accompanying drawings.

Figure 1:
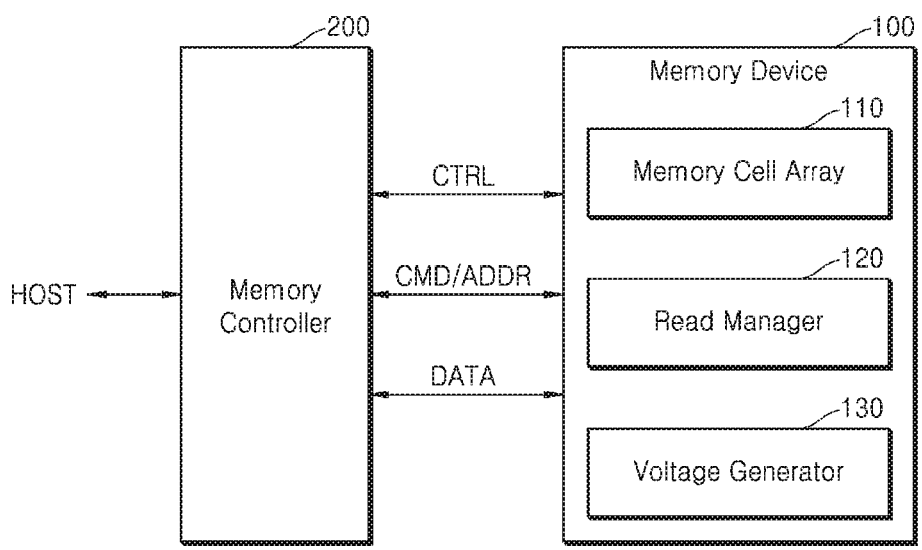
FIG. 1 is a block diagram illustrating a memory system according to an exemplary embodiment of the inventive concept.

FIG. 1 is a block diagram illustrating a memory system according to an exemplary embodiment of the inventive concept.

Referring to FIG. 1, a memory system 10 includes a memory device 100, a memory controller 200 (e.g., a control circuit), and the memory device 100 may be a nonvolatile memory device.

The memory controller 200 may include a processor, and the memory controller 200 may control various memory operations of the memory device 100 using a method based on hardware, software, and a combination thereof under a control of the processor. The memory controller 200 may control the memory device 100 to read data stored in the memory device 100 or write data to the memory device 100 in response to write and read requests from a host HOST.

In detail, the memory controller 200 may provide an address ADDR, a command CMD, and a control signal CTRL to the memory device 100 to control programming (or writing), a read operation, and an erase operation for the memory device 100. In addition, data DATA to be written and the read data DATA may be transmitted and received between the memory controller 200 and the memory device 100.

Although not illustrated, the memory controller 200 may further include a random-access memory (RAM), a host interface (e.g., an interface circuit), and a memory interface (e.g., an interface circuit). The RAM may be used as an operation memory of the processor. The host interface may support a communication protocol for exchanging data between the host HOST and the memory controller 200. The memory controller 200 may communicate with the host through at least one of various protocols, and may be configured to communicate with the host HOST through at least one of various interface protocols such as Universal Serial Bus (USB), Multi Media Card (MMC), Peripheral Component Interconnect Express (PCI-E), advanced technology attachment (ATA), serial-ATA, parallel-ATA, Small Computer System Interface (SCSI), and integrated drive electronics (IDE).

The memory controller 200 and the memory device 100 may be implemented as separate semiconductor devices. Alternatively, the memory controller 200 and the memory device 100 may be integrated into one semiconductor device. Exemplarily, the memory controller 200 and the memory device 100 may be integrated into one semiconductor device to form a memory card. For example, the memory controller 200 and the memory device 100 may be integrated into one semiconductor device to form a PC card (personal computer memory card international association (PCMCIA)), a compact flash (CF) card, a smart media card (SM/SMC), a memory stick, multimedia cards (MMC, reduced size MMC (RS-MMC), and MMCmicro), SD cards (SD, miniSD, and microSD), or a universal flash storage (UFS).

The memory device 100 includes a memory cell array 110, a read manager 120, and a voltage generator 130. The memory cell array 110 may include a plurality of resistive memory cells, and thus, the memory device 100 may also be referred to as a "resistive memory device".

Moreover, the memory device 100 may be implemented in various forms. As an example, the memory device 100 may be a device implemented as one memory chip. Alternatively, the memory device 100 may be a device including a plurality of memory chips, and as an example, the memory device 100 may be a memory module in which a plurality of memory chips are mounted on a board. However, embodiments of the inventive concept are not limited thereto, and the memory device 100 may be implemented in various forms such as a semiconductor package including one or more memory dies.

According to an exemplary embodiment of the inventive concept, the memory cell array 110 includes a plurality of resistive memory cells (not illustrated) respectively arranged in regions where a plurality of word lines WL and a plurality of bit lines BL cross each other. Accordingly, the memory device 100 may be referred to as a "cross-point memory". An embodiment in which the memory device 100 is a cross-point memory will be described below with reference to FIGS. 3 to 7.

Each of the plurality of resistive memory cells may be a single level cell (SLC) storing one bit or may be a multilevel cell (MLC) capable of storing data of at least two bits or more. In addition, the memory cells may have a plurality of resistance distributions according to the number of bits stored in each memory cell. As an example, when one-bit data is written to one memory cell, the memory cells may have two resistance distributions (e.g., two possible resistance values or states to represent logic 0 and logic 1), and when two-bit data is stored in one memory cell, the memory cells may have four resistance distributions (e.g., four possible resistance values or states to represent logic 00, logic 01, logic 10, and logic 11).

Moreover, the memory cell array 110 may include resistive memory cells each including a variable resistance element (not illustrated). For example, when the variable resistance element includes a phase change material and the resistance changes with temperature, the resistive memory device may be referred to as a phase-change random access memory (PRAM). In another example, when the variable resistance element is formed of an upper electrode, a lower electrode, and a complex metal oxide therebetween, the resistive memory device may be referred to as an RRAM. In another example, when the variable resistance element is formed of an upper electrode of a magnetic material, a lower electrode of the magnetic material, and a dielectric material therebetween, the resistive memory device may be referred to as a MRAM.

According to an exemplary embodiment of the inventive concept, the memory cell array 110 is a resistive switching-based vertical stacked memory cell array in which a plurality of resistive memory cells are stacked vertically and may be referred to as an A-vertical NAND (A-VNAND). An embodiment in which the memory device 100 includes the vertical memory cell array in which the resistive memory cells are stacked will be described below with reference to FIGS. 8 to 10.

According to an exemplary embodiment of the inventive concept, the memory cell array 110 is a resistive switching-based vertical stacked memory cell array including merged or hybrid memory cells stacked vertically. For example, each merged memory cell stores data in a resistive memory element and a charge trap layer. The memory cell array 110 including the merged memory cells may be referred to as an ACE-vertical NAND (ACE-VNAND). In the present specification, a merged memory cell means a memory cell that stores data in two ways in one memory cell by simultaneously including the resistive memory element and the charge trap layer. An embodiment in which the memory device 100 includes a vertical memory cell array in which the merged memory cells are stacked will be described below with reference to FIGS. 11 to 13.

The read manager 120 (e.g., a processor) may perform a data read operation by controlling various configuration elements of the memory device 100. For example, the read manager 120 may output various control signals for reading data from the memory cell array 110, based on the command CMD, the address ADDR, and the control signal CTRL received from the memory controller 200 of FIG. 1.

The voltage generator 130 may generate various types of voltages for reading data from the memory cell array 110, based on a control of the read manager 120. In one example, when a read operation is performed on a selected memory cell, the voltage generator 130 generates a plurality of read voltages for reading data and provides the plurality of generated read voltages to a bit line connected to the selected memory cell.

According to an exemplary embodiment of the inventive concept, the read manager 120 controls the voltage generator 130 to generate a plurality of read voltages, and sequentially applies the plurality of read voltages to the bit line to read data from the memory cell array 110, and the memory device 100 determines a value of the read data based on a current amount that varies depending on the plurality of read voltages. By sequentially applying the plurality of read voltages, the memory device 100 may determine a value of the read data by using a small number of reference currents. Thus, complexity of a circuit element used to generate the reference currents may be reduced.

Figure 2:
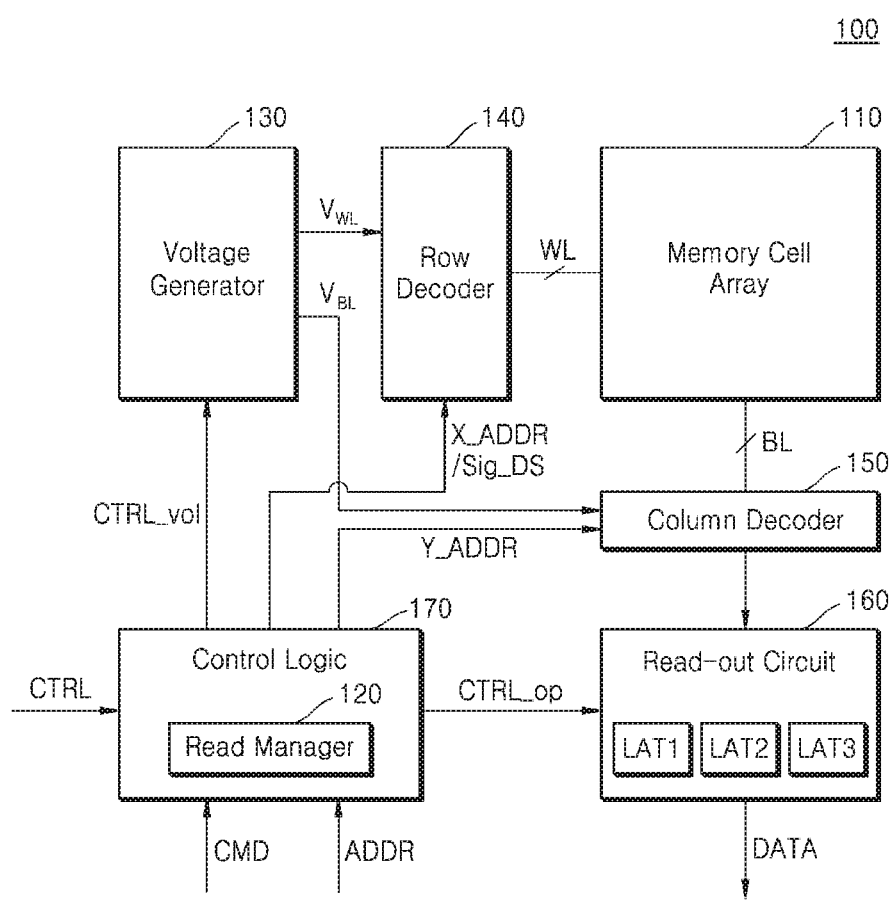
FIG. 2 is a block diagram illustrating a memory device according to an exemplary embodiment of the inventive concept.

FIG. 2 is a block diagram illustrating the memory device according to an exemplary embodiment of the inventive concept. For example, the memory device 100 of FIG. 2 may be used to implement the memory device 10 of FIG. 1.

Referring to FIG. 2, the memory device 100 includes a memory cell array 110, a voltage generator 130, a row decoder 140 (e.g., a decoder circuit), a column decoder 150 (e.g., a decoder circuit), a read-out circuit 160, and control logic 170 (e.g., a logic circuit, a control circuit, or a processor), and the control logic 170 includes the read manager 120 (e.g., a program stored in a memory of the control logic 170 and executed by the control logic 170).

As described above with reference to FIG. 1, the memory cell array 110 may include one of a cross-point memory cell array, a memory cell array in which resistive memory cells are vertically stacked, and a memory cell array in which merged memory cells are vertically stacked.

The row decoder 140 may be connected to the memory cell array 110 through a plurality of word lines WL and activate a word line selected from among the plurality of word lines in response to a row address (e.g., X_ADDR) generated as a result of decoding the address ADDR. Hereinafter, in the present specification, the selected word line refers to a word line connected to the selected memory cell among the plurality of word lines.

The row decoder 140 may control a voltage applied to the selected word line among the plurality of word lines WL or control a connection relationship between a selected word line in response to the row address. The row decoder 140 may include a plurality of transistors, and at least one transistor may be connected to each of the plurality of word lines. The selected word line may be activated for write and read operations through a turn-on or turn-off operation of the one or more of the plurality of transistors.

Although not illustrated, the row decoder 140 may be connected to the memory cell array 110 through a string selection line. The string selection line may refer to a signal line for selecting a plurality of cell strings included in the memory cell array 110.

The column decoder 150 may be connected to the memory cell array 110 through a plurality of bit lines BL and activate a selected bit line among the plurality of bit lines BL in response to a column address (e.g., Y_ADDR) generated as a result of decoding the address ADDR. Hereinafter, in the present specification, the selected bit line may refer to a bit line connected to a selected memory cell among the plurality of bit lines BL.

The column decoder 150 may control a voltage applied to the selected bit line among the plurality of bit lines BL or control a connection relationship between the selected bit line in response to the column address. In addition, the column decoder 150 may apply a bit line voltage VBL to the selected bit line under a control of the control logic 170.

The control logic 170 may perform memory operations such as data writing and data reading by controlling various configuration elements of the memory device 100. For example, the control logic 170 may output various control signals for writing data to the memory cell array 110 or reading data from the memory cell array 110, based on the command CMD, the address ADDR, and the control signal CTRL received from the memory controller 200 of FIG. 1.

The various control signals output from the control logic 170 may be provided to the read-out circuit 160, the voltage generator 130, the row decoder 140, and the column decoder 150. In an exemplary embodiment, the control logic 170 provides an operation selection signal CTRL op to the read-out circuit 160 and provides a voltage control signal CTRL_vol to the voltage generator 130. In addition, the control logic 170 may provide a row address X_ADDR to the row decoder 140 and a column address Y_ADDR to the column decoder 150 by decoding the address ADDR.

When sequentially applying a plurality of read voltages to the selected bit line, the control logic 170 according to an exemplary embodiment of the inventive concept deactivates a string selection line connected to the selected memory cell. To this end, the control logic 170 may output a string selection line deactivation signal Sig_DS to the row decoder 140, and accordingly, the row decoder 140 may deactivate the string selection line. This will be described below in detail with reference to FIGS. 15 to 19.

In one example, when performing a read operation, the control logic 170 controls word line and bit line selection operations of the row decoder 140 and the column decoder 150 and a sensing operation of the read circuit 160 to read data from the selected memory cell and controls the voltage generator 130 such that voltages provided to the row decoder 140, the column decoder 150, and the read-out circuit 160 have set voltage levels. According to an exemplary embodiment of the inventive concept, the control logic 170 controls the voltage generator 130 to generate a plurality of read voltages and sequentially applies the plurality of read voltages to the selected bit line to read data from the memory cell array 110.

The voltage generator 130 may generate various types of voltages for performing a write operation, a read operation, and an erase operation for the memory cell array 110 based on a voltage control signal CTRL_vol. Specifically, the voltage generator 130 may generate word line voltages $V_{WL}$ for driving the plurality of word lines WL and bit line voltages $V_{BL}$ for driving the plurality of bit lines BL. For example, when performing the read operation, the voltage generator 130 may generate a first precharge voltage, a discharge voltage, and a turn-on or turn-off voltage for the transistors included in the row decoder 140 as word line voltages $V_{WL}$, and generate a second precharge voltage, a clamping voltage, a turn-on or turn-off voltage for the transistors of the column decoder 150, and a plurality of read voltages as the bit line voltages $V_{BL}$. In addition, the voltage generator 130 may generate various voltages (for example, a set write voltage, reset write voltage or a reference voltage) and the like provided to the read-out circuit 160.

The read-out circuit 160 may be selectively connected to the bit lines BL and/or the word lines WL and read data written in selected memory cells. For example, the read-out circuit 160 may determine a program state of a selected memory cell by detecting a current from a bit line connected to the selected memory cell and comparing the current with a reference current. According to an exemplary embodiment of the inventive concept, the read-out circuit 160 includes a plurality of latches LAT1 to LAT3 (e.g., latch circuits) and stores information on the program state of the selected memory cell in the plurality of latches LAT1 to LAT3. Although three latches LAT1 to LAT3 are illustrated in FIG. 2, this is merely an example since more or fewer latches may be included in the read-out circuit 160.

In the read operation for the memory cell array 110 according to an exemplary embodiment of the inventive concept, a plurality of read voltages are applied to the selected bit line. For example, a voltage between the selected word line and the selected bit line may have different level differences for each of the plurality of read voltages. After the precharge operation for the selected word line and the selected bit line has completed, a level of a current detected from at least one of the selected word line and the selected bit line may vary depending on a program state of the selected memory cell.

In one example, when an operation of sensing data is performed by using the current detected from the selected bit line, a level of the current detected from the selected word line may vary depending on the program state of the selected memory cell. For example, when the level of the current detected from the selected word line is larger than a predetermined reference level, data of "1" may be sensed since the selected memory cell is in a reset state, and when the level of the current detected from the selected word line is smaller than the predetermined reference level, data of "0" may be sensed since the selected memory cell is in a set state. In another example, the memory device 100 may be implemented to sense data by using a voltage detected from the selected bit line.

Figure 3:
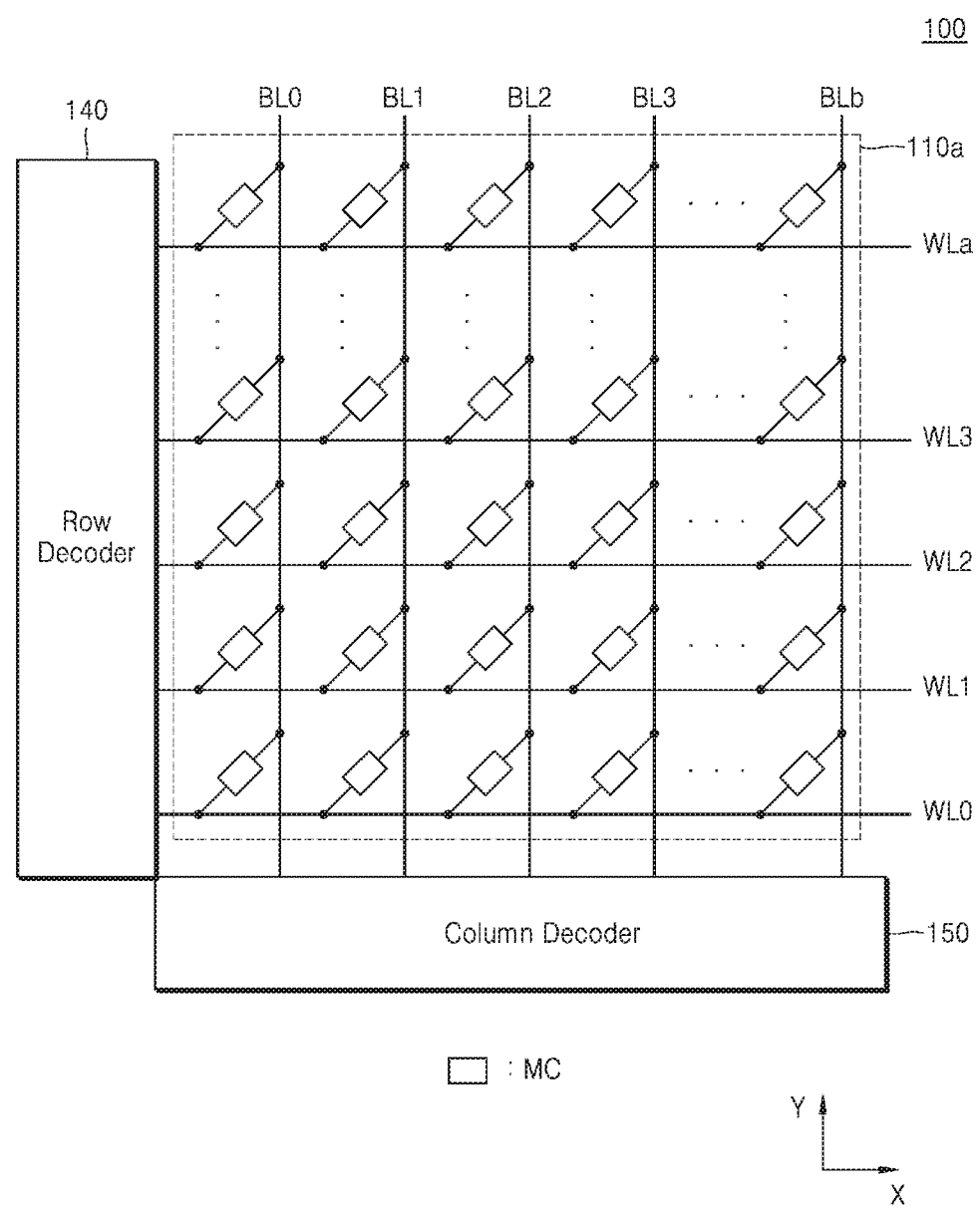
FIG. 3 is a diagram illustrating a part of a memory device according to an exemplary embodiment of the inventive concept.
Figure 4:
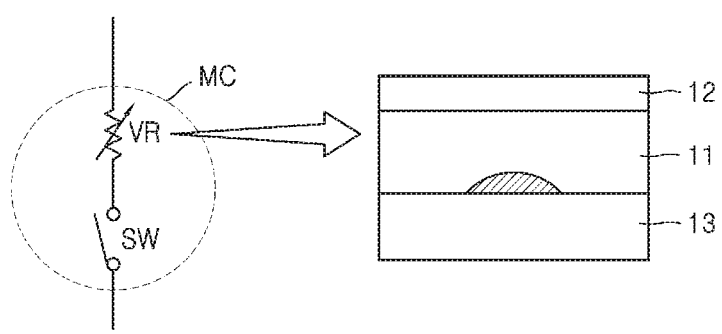
FIG. 4 is a diagram illustrating a memory cell according to an exemplary embodiment of the inventive concept.

FIG. 3 illustrates a part of the memory device 100 according to an exemplary embodiment of the inventive concept, and FIG. 4 illustrates a memory cell of the memory device according to an exemplary embodiment of the inventive concept. FIGS. 3 and 4 illustrate a case where the memory device 100 is a cross-point memory and the memory cell (e.g., a resistive memory cell) is PRAM. A memory cell array 110a illustrated in FIG. 3 may correspond to one cell block.

Referring to FIG. 3, the memory device 100 includes the memory cell array 110a, the row decoder 140, and the column decoder 150, and the memory cell array 110a is disposed adjacent to the row decoder 140 in a first direction (for example, X direction) and is disposed adjacent to the column decoder 150 in a second direction (for example, Y direction).

The memory cell array 110a may be a two-dimensional memory cell array having a horizontal structure and include a plurality of word lines WL0 to WLa, a plurality of bit lines BL0 to BLb, and a plurality of memory cells MC. The memory cell array 110a may include a plurality of memory blocks. Each memory block may have a plurality of memory cells arranged in rows and columns. Here, the number of word lines WL, the number of bit lines BL, and the number of memory cells MC may vary depending on embodiments.

According to an exemplary embodiment of the inventive concept, each of the plurality of memory cells MC includes a variable resistance element and a switching element SW. Here, the variable resistance element VR may be referred to as a variable resistance material, and the switching element SW may be referred to as a selection element.

According to an exemplary embodiment, the variable resistance element VR is connected between one of the plurality of bit lines BL0 to BLb and the switching element SW, and the switching element SW is connected between the variable resistance element VR and one of the plurality of word lines WL0 to WLa. However, the inventive concept is not limited thereto, and the switching element SW may be connected between one of the plurality of bit lines BL0 to BLb and the variable resistance element VR, and the variable resistance element VR may be connected between the switching element SW and one of the plurality of word lines WL0 to WLa.

The switching element SW may be connected between any one of the plurality of word lines WL0 to WLa and the variable resistance element VR and control supply of a current to the variable resistance element VR according to the voltage applied to the connected word line and the connected bit line. The switching element SW may be implemented with an ovonic threshold switching (OTS) material. However, the inventive concept is not limited thereto, and in other embodiments, the switching element SW may be changed to another switchable element such as a unidirectional diode, a bidirectional diode, and a transistor.

A voltage may be applied to the variable resistance element VR of the memory cell MC through the word lines WL0 to WLa and the bit lines BL0 to BLb, and thus, a current may be applied to the variable resistance element VR. For example, the variable resistance element VR may include a phase change material layer capable of reversibly changing between a first state and a second state. However, the variable resistance element VR is not limited thereto and may include any variable resistance member of which a resistance value varies depending on an applied voltage. For example, the selected memory cell MC may reversibly change resistance of the variable resistance element VR depending on a voltage applied to the variable resistance element VR between the first state and the second state.

Depending on the change of resistance of the variable resistance element VR, the memory cell MC may store digital information such as "0" or "1" and may also erase the digital information from the memory cell MC. For example, data may be written to the memory cell MC in a high resistance state "0" and a low resistance state "1". Here, writing from the high resistance state "0" to the low resistance state "1" may be referred to as a "set operation", and writing from the low resistance state "1" to the high resistance state "0'" may be referred to as a "reset' operation". However, the memory cell MC according to embodiments of the inventive concept is not limited to the digital information of the high resistance state "0" and the low resistance state "1" illustrated above and may store various resistance states.

A certain memory cell MC may be addressed by selecting the plurality of word lines WL0 to WLa and the plurality of bit lines BL0 to BLb, and the memory cell MC may be programmed by applying a predetermined signal (for example, voltage or current) between the plurality of word lines WL0 to WLa and the plurality of bit lines BL0 to BLb. According to an exemplary embodiment of the inventive concept, the voltage is measured through a selected word line among the plurality of word lines WL0 to WLa, and thus, information according to a resistance value of the variable resistance element VR of the selected memory cell MC, that is, programmed data, may be read.

The switching element SW may be implemented by using various elements such as a transistor and a diode. The variable resistance element VR may include a phase change film 11 (or a variable resistance layer) formed of a mixture of germanium, stibium, and tellurium (GST, Ge—Sb—Te), an upper electrode 12 formed on the phase change film 11, and a lower electrode 13 formed under the phase change film 11.

The upper electrode 12 and the lower electrode 13 may be formed of various metals, metal oxides, or metal nitrides. The upper electrode 12 and the lower electrode 13 may be formed of aluminum (Al), copper (Cu), titanium nitride (TiN), titanium aluminum nitride (TixAlyNz), iridium (Jr), platinum (Pt), silver (Ag), gold (Au), polysilicon, tungsten (W), titanium (Ti), tantalum (Ta), tantalum nitride (TaN), tungsten nitride (WN)), nickel (Ni), cobalt (Co), chromium (Cr), stibium (Sb), iron (Fe), molybdenum (Mo), palladium (Pd), Comment (Sn), Zirconium (Zr), zinc (Zn), iridium oxide ($IrO_2$), strontium zirconate oxide ($StZrO_3$), or so on.

The phase change film 11 may be formed of a bipolar resistive memory material or a unipolar resistive memory material. The bipolar resistive memory material may be programmed in a set or reset state by the polarity of the current, and Perovskite-based materials may be used for the bipolar resistive memory material. Moreover, the unipolar resistive memory material may be programmed in a set or reset state even by a current of the same polarity, and a transition metal oxide such as NiOx or TiOx may be used as the unipolar resistive memory material.

The GST material may be programmed between an amorphous state with a relatively high resistance and a crystalline state with a relatively low resistance. The GST material may be programmed by heating the GST material. A magnitude and time of heating may determine whether the GST material remains in an amorphous state or a crystalline state. A high resistivity and a low resistivity may be represented by programmed values, which are logic 0 or logic 1, respectively, and may be sensed by measuring a resistivity of the GST material. In contrast to this, the high resistivity and the low resistivity may be represented by programmed values which are logic 1 or logic 0, respectively.

Figure 5:
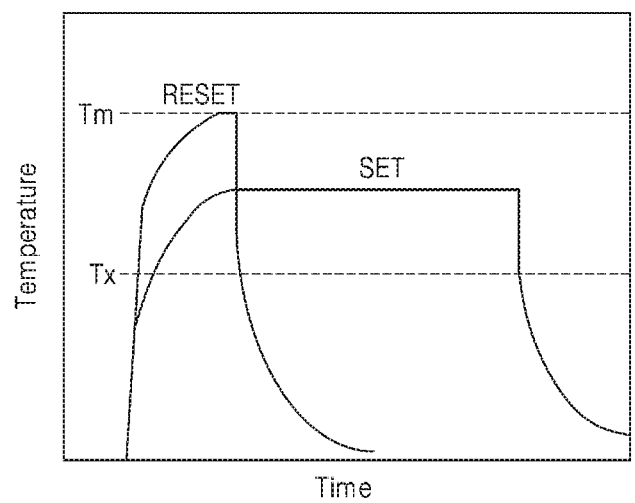
FIG. 5 is a graph illustrating set and reset writes for a variable resistance element of a memory cell according to an exemplary embodiment of the inventive concept.

FIG. 5 is a graph illustrating set and reset writing for the variable resistance element of the memory cell according to an exemplary embodiment of the inventive concept.

Referring to FIG. 5, if the phase change material configuring the variable resistance element (VR of FIG. 4) is heated to a temperature between a crystallization temperature Tx and a melting point Tm for a predetermined time and then gradually cooled, the phase change material enters a crystalline state. This determination state is referred to as a "set state" and is a state where data "0" is stored. Moreover, if the phase change material is heated to a temperature above the melting point Tm and then quickly cooled, the phase change material enters an amorphous state. This amorphous state is referred to as a 'reset state' and is a state where the data '1' is stored. Accordingly, data may be stored by supplying a current to the variable resistance element VR, and the data may be read by measuring a resistance value of the variable resistance element VR.

Figure 6:
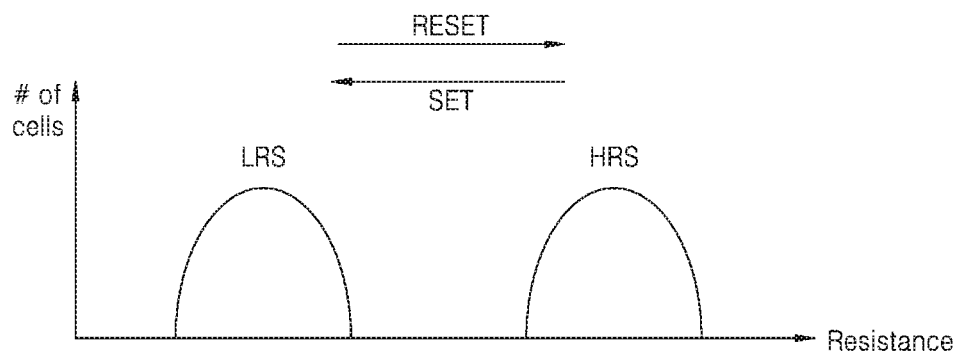
FIG. 6 is a graph illustrating a distribution of memory cells according to resistance when a memory cell according to an exemplary embodiment of the inventive concept is a single level cell.
Figure 7:
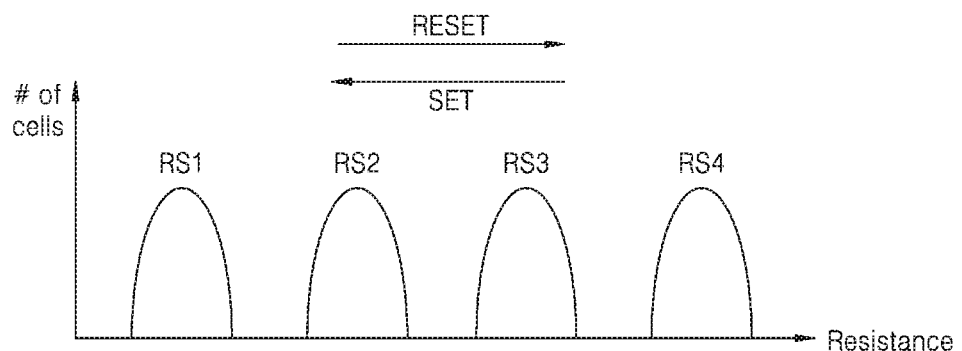
FIG. 7 is a graph illustrating a distribution of memory cells according to resistance when a memory cell according to an exemplary embodiment of the inventive concept is a multi-level cell.

FIG. 6 is a graph illustrating a distribution of the memory cells according to resistance when the memory cell according to an exemplary embodiment of the inventive concept is a single level cell, and FIG. 7 is a graph illustrating a distribution of the memory cells according to resistance when the memory cell according to an exemplary embodiment of the inventive concept is a multilevel cell.

Referring to FIG. 6, the horizontal axis represents resistance, and the vertical axis represents the number of memory cells MC. For example, when the memory cell MC is a single level cell SLC programmed with 1 bit, the memory cell MC may have a low resistance state LRS or a high resistance state HRS.

The low resistance state LRS and the high resistance state HRS may correspond to any one of data "0" and data "1". According to an embodiment, a resistance level VR increases in an order of data "0" to data "1". That is, the low resistance state LRS may correspond to the data "0", and the high resistance state HRS may correspond to the data "1".

An operation of switching the memory cell MC from the high resistance state HRS to the low resistance state LRS by applying a program current to the memory cell MC is referred to as a set operation or a set write operation. In addition, an operation of switching the memory cell MC from the low resistance state LRS to the high resistance state HRS by applying the program current to the memory cell MC is referred to as a reset operation or a reset write operation.

Referring to FIG. 7, the horizontal axis represents resistance, and the vertical axis represents the number of memory cells MC. For example, when the memory cell MC is a multilevel cell (MLC) programmed with two bits, the memory cell MC may have one of a first resistance state RS1, a second resistance state RS2, a third resistance state RS3, and a fourth resistance state RS4. However, the inventive concept is not limited thereto, and in another embodiment, the plurality of memory cells may include triple level cells (TLC) that store data of three bits, and accordingly, the memory cell may have one of eight resistance states. In another embodiment, the plurality of memory cells may include memory cells capable of respectively storing data of four bits or more.

Each of the first to fourth resistance states RS1, RS2, RS3, and RS4 may correspond to any one of data "00", data "01", data "10", and data "11". According to an exemplary embodiment, the resistance level VR is increased in an order of data "11", data "01", data "00", and data "10". That is, the first resistance state RS1 corresponds to data "11", the second resistance state RS2 corresponds to data "01", the third resistance state RS3 corresponds to data "00", and the fourth resistance state RS4 corresponds to data "10".

Figure 8:
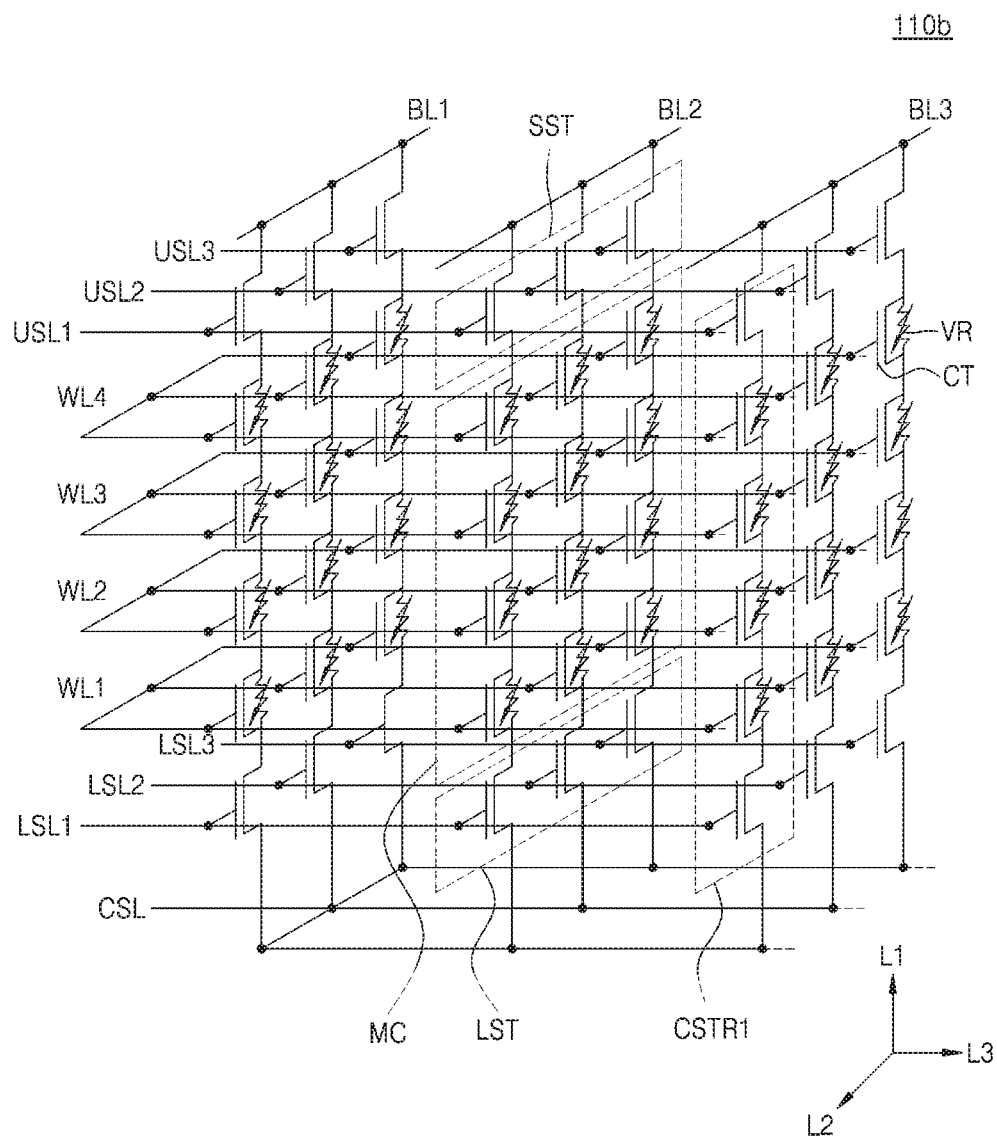
FIG. 8 is a circuit diagram illustrating a memory cell array according to an exemplary embodiment of the inventive concept.
Figure 9:
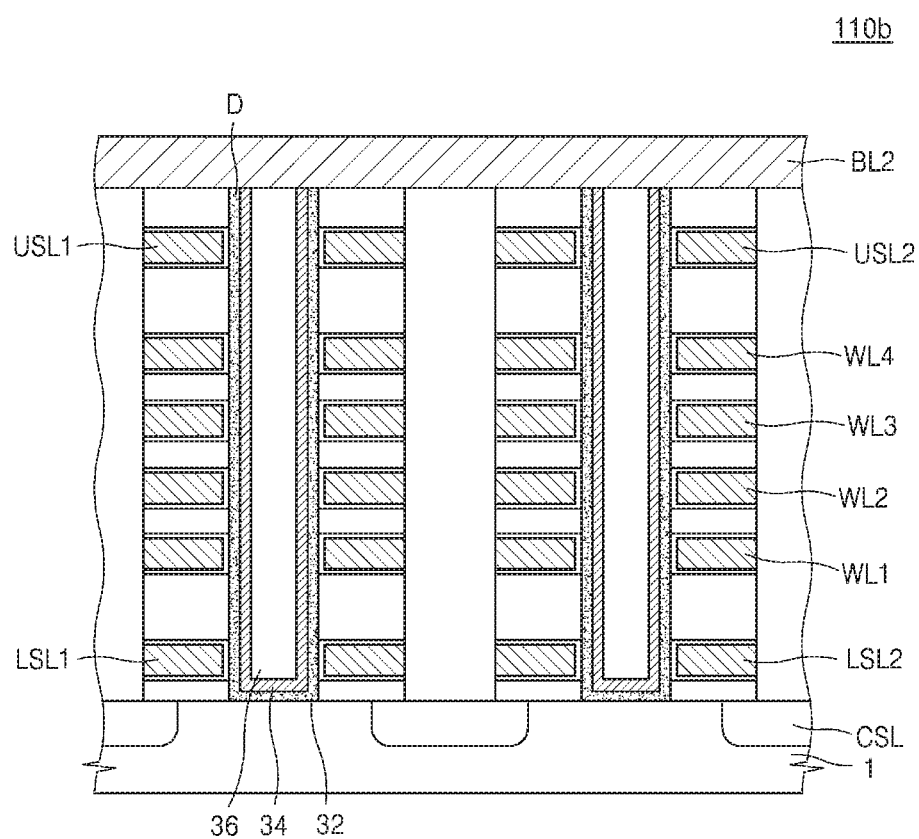
FIG. 9 is a cross-sectional view illustrating a memory cell array according to an exemplary embodiment of the inventive concept.

FIG. 8 illustrates a circuit diagram of the memory cell array 110b according to an exemplary embodiment of the inventive concept, and FIG. 9 illustrates a cross-sectional view of the memory cell array 110b according to an exemplary embodiment of the inventive concept. In detail, FIGS. 8 and 9 illustrate embodiments in which a memory cell array 110b is a resistive vertical stacked memory cell array. For example, the memory cell array 110b may be used to implement the memory cell array 110 of FIG. 2.

Referring to FIG. 8, the memory cell array 110b includes a common source line CSL, the plurality of bit lines BL1, BL2, and BL3, and a plurality of cell strings CSTR1 disposed between the common source line CSL and the plurality of bit lines BL1 to BL3. The plurality of cell strings CSTR include a plurality of memory cells MC, and each of the plurality of memory cells MC include a cell transistor CT controlled by the plurality of word lines WL1 to WL4 and the variable resistance element VR. The variable resistance element VR may store data in the method described above with reference to FIGS. 4 to 7.

Referring to FIG. 9, the common source line CSL is disposed in a substrate 1. The substrate 1 may be a semiconductor substrate itself or an epitaxial semiconductor layer formed thereon. The common source line CSL may be an impurity injection region formed in the substrate 1. The common source line CSL may be doped with impurities of a conductivity type different from a conductivity type of the substrate 1. In one example, the substrate 1 is doped with P-type impurities. The common source line CSL may be doped with, for example, N-type impurities.

An active pillar 32 protrudes from the substrate 1 in a first direction L1. The active pillar 32 may have a hollow structure. The active pillar 32 may be in contact with the substrate 1. The active pillar 32 may include, for example, polysilicon doped with or without P-type impurities. In an exemplary embodiment, a thickness of the active pillar 32 is less than or equal to 50 nm. With such a thin thickness, an electric field may effectively be applied to a variable resistive film 34 when a subsequent resistive memory device is driven.

A drain region D is disposed on the active pillar 32. The drain region D may be doped with impurities of the same type as the common source line CSL. The bit lines BL1 to BL3 may be disposed on the active pillar 32 and may be electrically connected to the drain region D. The bit lines BL1-BL3 extend in the second direction L2 and are spaced apart in parallel with each other.

The plurality of cell strings CSTR1 are connected in parallel to each of the bit lines BL1 to BL3. The cell strings CSTR1 are connected in parallel to the common source line CSL. Each of the cell strings CSTR1 is disposed adjacent to one of the active pillars 32. Each of the cell strings CSTR1 may include a lower selection transistor LST connected to the common source line CSL, an upper selection transistor SST connected to the bit lines BL1 to BL3, and the plurality of memory cells MC disposed between the lower selection transistor LST and the upper selection transistor SST. The lower selection transistor LST, the upper selection transistor SST, and the memory cells MC may be connected in series. Channel regions of all the lower selection transistor LST, the upper selection transistor SST, and the memory cells MC may be formed in the active pillar 32.

The upper selection transistor SST may use upper selection lines USL1 to USL3 as a gate electrode and may include a drain region D. The upper selection transistors SST may be disposed at substantially the same distance from the substrate 1. The upper selection lines USL1 to USL3 extend in a third direction L3 and are parallel to each other.

The lower selection transistor LST may use the lower selection lines LSL1 to LSL3 as a gate electrode. The lower selection transistors LST may be disposed at substantially the same distance from the substrate 1. The upper selection lines USL1 to USL3 extend in a third direction L3 and are parallel to each other.

Each of the plurality of memory cells MC includes the cell transistor CT and the variable resistance film 34. The cell transistor CT may use the word lines WL1 to WL4 as a gate electrode and may include field effect source and drain regions that may be formed in the active pillars 32 on both sides thereof. Gate electrodes of the cell transistors located at the same height from the substrate 1 may be commonly connected to one of the word lines WL1 to WL4.

The lower selection transistor LST, the upper selection transistor SST, and the cell transistor CT may be a metal oxide semiconductor field effect transistor (MOSFET) using the active pillar 32 as a channel region.

The variable resistance film 34 may be in direct contact with the active pillar 32. The inside of the active pillar 32 may be filled with a buried insulating film 36. The buried insulating film 36 may include, for example, a silicon oxide film-based material. The variable resistance film 34 is between the buried insulating film 36 and the active pillar 32. The variable resistance film 34 may have a cup shape covering the inner bottom and sidewalls of the active pillar 32. The variable resistance film 34 may vary in resistance value depending on a given condition and serve as the variable resistance element VR.

Figure 10:
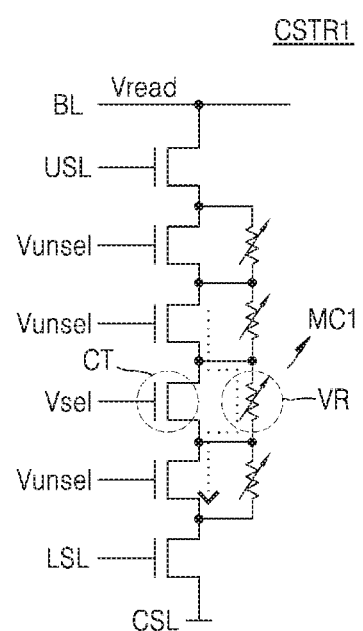
FIG. 10 is a circuit diagram illustrating a cell string according to an exemplary embodiment of the inventive concept.

FIG. 10 is a circuit diagram illustrating the cell string CSTR1 according to an exemplary embodiment of the inventive concept. In detail, FIG. 10 illustrates one cell string CSTR1 included in the memory cell array 110b illustrated in FIG. 8.

Referring to FIG. 10, the cell string CSTR1 may include a plurality of memory cells. In a read process (e.g., during a read operation), when a first memory cell MC1 included in the cell string CSTR1 is selected, a read voltage Vread is applied to the bit line BL. In addition, a selection voltage Vsel is applied to the cell transistor CT of the first memory cell MC1, and a non-selection voltage Vunsel is applied to cell transistors of the other memory cells. The selection voltage Vsel may be a voltage for turning off the cell transistor CT, and the non-selection voltage Vunsel may be a voltage for turning on the cell transistor CT. In one example, the selection voltage Vsel has a voltage level that is lower than a threshold voltage of the cell transistor CT, and the non-selection voltage Vunsel has a voltage level that is higher than the threshold voltage of the cell transistor CT.

According to application of the above-described voltages, all cell transistors other than the cell transistor CT of the selected first memory cell MC1 are turned on, and the cell transistor of the first memory cell MC1 is turned off. Accordingly, a current according to the read voltage Vread flows through the variable resistance element VR of the first memory cell MC1, and different current values may be measured depending on the variable resistance elements VR.

The memory device according to an exemplary embodiment of the inventive concept sequentially changes a voltage level of the read voltage Vread, and thus, a current value according to the variable resistance element VR may be measured, and a resistance value of the variable resistance element VR may be measured through the current value. In addition, the memory device may determine a program state by measuring the resistance value of the variable resistance element VR.

Figure 11:
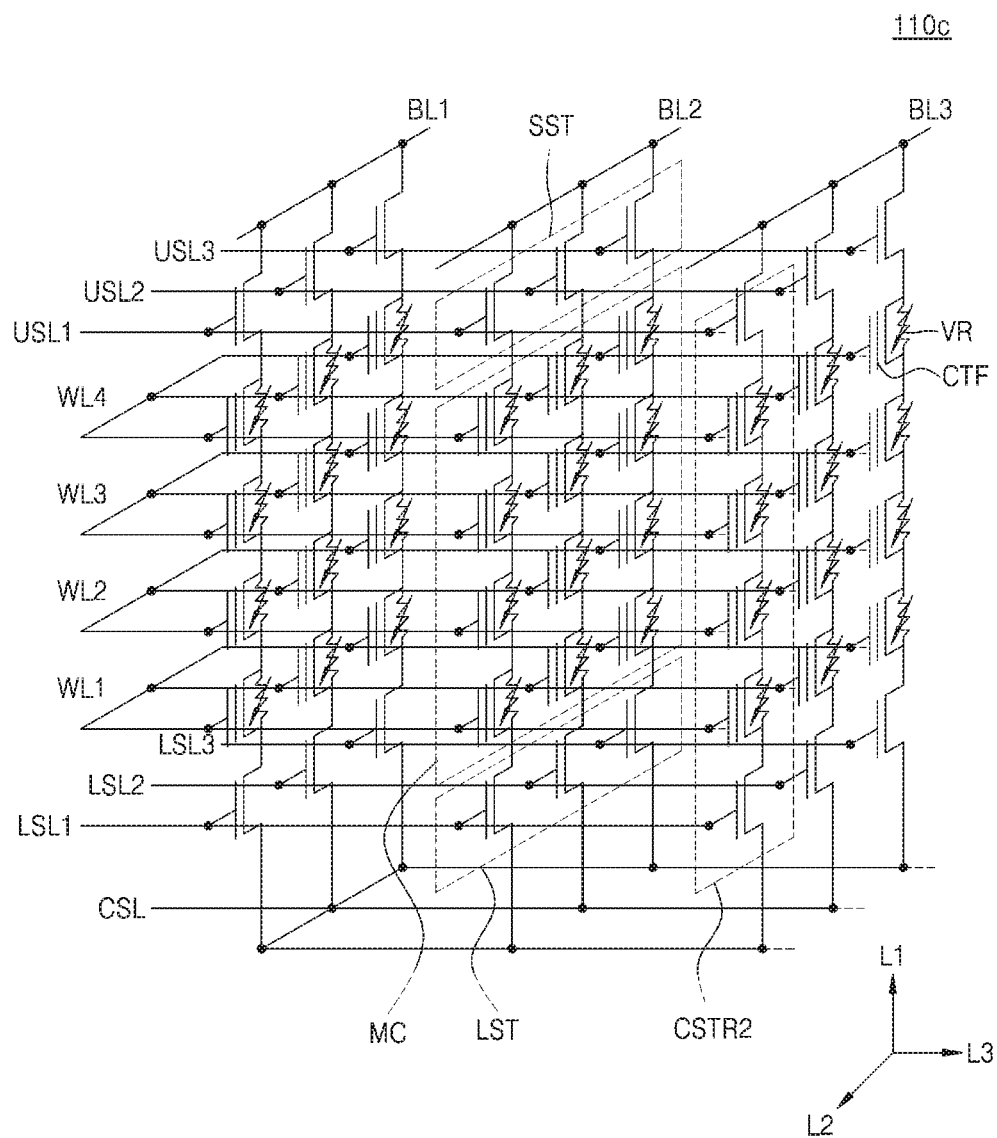
FIG. 11 is a circuit diagram illustrating a memory cell array according to an exemplary embodiment of the inventive concept.
Figure 12:
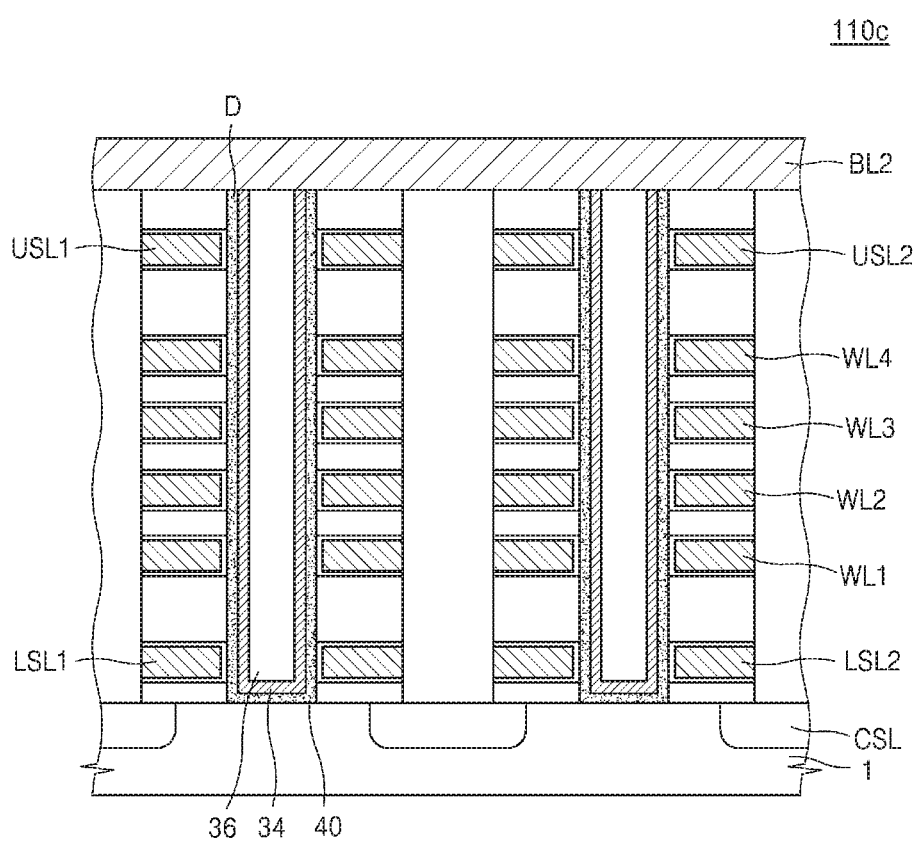
FIG. 12 is a cross-sectional view illustrating a memory cell array according to an exemplary embodiment of the inventive concept.

FIG. 11 illustrates a circuit diagram of a memory cell array 110c according to an exemplary embodiment of the inventive concept, and FIG. 12 illustrates a cross-sectional view of the memory cell array 110c according to an exemplary embodiment of the inventive concept. In detail, FIGS. 11 and 12 illustrate embodiments in which a memory cell array 110c is a merged vertical stacked memory cell array. For example, the memory cell array 110 of FIG. 2 may be replaced with the memory cell array 110c of FIG. 11. Descriptions already given above with reference to FIGS. 8 and 9 are omitted.

Referring to FIG. 11, the memory cell array 110c includes the common source line CSL, the plurality of bit lines BL1 to BL3 and a plurality of cell strings CSTR2 disposed between the common source line CSL and the bit lines BL1 to BL3. The plurality of cell strings CSTR2 include a plurality of memory cells MC, and each of the plurality of memory cells MC include a charge trap layer CTF and the variable resistance element VR controlled by the plurality of word lines WL1 to WL4.

The memory cell MC according to the embodiment of the inventive concept may store first data by using the charge trap layer CTF and store second data by using the variable resistance element VR. The memory device may determine data stored in the variable resistance element VR in the method described above with reference to FIGS. 8 to 10 by turning off the charge trap layer CTF of the memory cell MC and may determine data stored in the charge trap layer CTF by controlling a gate voltage of the memory cell MC.

Referring to FIG. 12, a charge storage film 40 is included instead of the active pillar 32 of the memory cell array 110b of FIG. 9. The charge storage film 40 may serve as a charge trap layer CTF for storing data, and, when the data is stored by trapping charges in the charge storage film 40, the charge storage film 40 may include silicon nitride or a metal oxide. The metal oxide may include, for example, aluminum oxide. As another example, when data is stored by floating charges in the charge storage film 40, the charge storage film 40 may include silicon. The charge storage film 40 may include, for example, silicon doped with impurities or undoped silicon.

Although not illustrated, a blocking film and a tunnel insulating film may be further included around the charge storage film 40.

Figure 13:
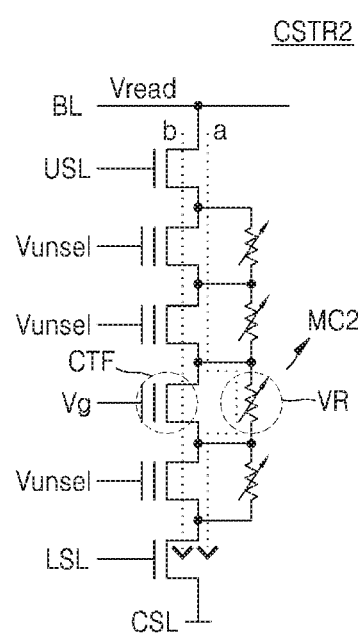
FIG. 13 is a circuit diagram illustrating a cell string according to an exemplary embodiment of the inventive concept.

FIG. 13 is a circuit diagram illustrating the cell string CSTR2 according to an exemplary embodiment of the inventive concept. In detail, FIG. 13 illustrates one cell string CSTR2 included in the memory cell array 110c illustrated in FIG. 11.

Referring to FIG. 13, the cell string CSTR2 may include a plurality of memory cells. In a read process, when the second memory cell MC2 included in the cell string CSTR2 is selected, the read voltage Vread is applied to the bit line BL. In addition, a gate voltage Vg is applied to the charge trap layer CTF of the second memory cell MC2, and a non-selection voltage Vunsel is applied to the cell transistors of the other memory cells.

According to application of the above-described voltages, all other charge trap layers than the charge trap layer CTF of the selected second memory cell MC2 are turned on, and thus, a current according to the read voltage Vread flows through the second memory cell MC2. A current may flow along a first route a according to a voltage level of the gate voltage Vg, or a current may flow along a second route b.

In one example, when the gate voltage Vg is lower than the lowest turn-on voltage of the charge trap layer CTF of the second memory cell MC2, the current according to the read voltage Vread flows along the first route a through the resistive memory element VR instead of the charge trap layer CTF, and data programmed in the resistive memory element VR may be determined. In another example, when the gate voltage Vg is greater than or equal to the lowest turn-on voltage of the charge trap layer CTF of the second memory cell MC2, the current according to the read voltage Vread flows to the charge trap layer CTF other than the resistive memory element VR along the second route b, and data programmed in the charge trap layer CTF may be determined.

Figure 14:
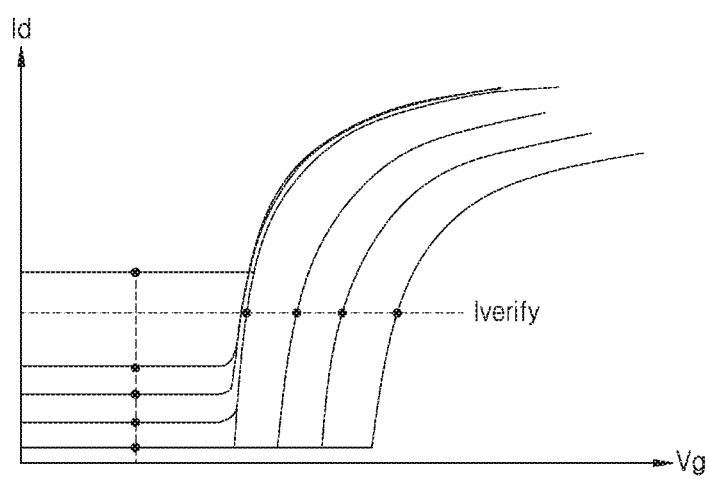
FIG. 14 is a graph illustrating a gate voltage-drain current of a memory cell according to an exemplary embodiment of the inventive concept.

FIG. 14 is a graph illustrating gate voltage-drain current of the memory cell according to an exemplary embodiment of the inventive concept. In detail, FIG. 14 illustrates the gate voltage-drain current of the merged memory cell described above with reference to FIGS. 11 to 13.

Referring to FIGS. 13 and 14, when the gate voltage Vg of the memory cell is lower than the lowest turn-on voltage of the cell transistor, the cell transistor is turned off, and thus, resistance levels of the resistive memory element VR may be distinguished. The resistance level of the resistive memory element VR in the memory cell may be divided into a plurality of levels.

The resistance level of the resistive memory element VR may be divided by a drain current Id. For example, the drain current Id may have any one of five states as illustrated. Accordingly, the resistance levels of the resistive memory element VR may be divided into five levels. According to an exemplary embodiment of the inventive concept, the resistance levels of the resistive memory element VR are distinguished by applying a plurality of read voltages having different voltage levels.

When the gate voltage Vg is higher than the lowest turn-on voltage of the charge trap layer CTF, the memory cell may be turned off or turned on depending on the charge storage state of the charge trap layer CTF. That is, a threshold voltage of the charge trap layer CTF in the memory cell may be divided into a plurality of levels.

The threshold voltage of the charge trap layer CTF may be distinguished through a voltage having a specified drain current value Iverify. For example, as illustrated in FIG. 14, the threshold voltage level may be any one of four levels. Accordingly, a threshold voltage of a second data storage structure may be divided into four levels.

As such, a memory cell according to an exemplary embodiment of the inventive concept includes two data storage elements in which data is stored in different mechanisms in one memory cell.

Figure 15:
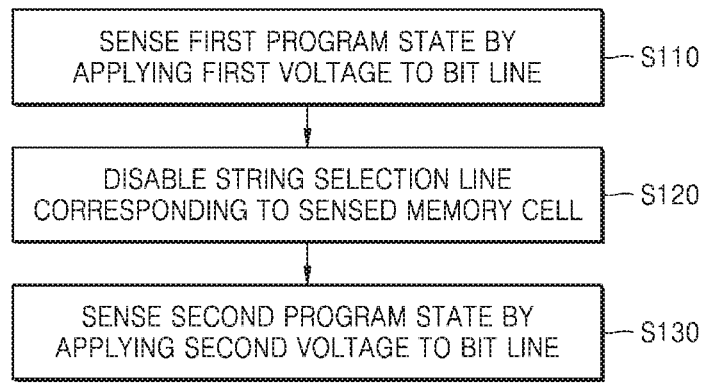
FIG. 15 is a flowchart illustrating a method of operating a memory device, according to an exemplary embodiment of the inventive concept.

FIG. 15 is a flowchart illustrating a method of operating a memory device, according to an exemplary embodiment of the inventive concept.

Referring to FIGS. 2 and 15, the memory device 100 senses a first program state by applying a first voltage to the bit line BL (S110). In one example, the first program state corresponds to a resistance value for a resistive memory element of the sensed memory cell selected by a selected word line.

The memory device 100 disables a string selection line corresponding to the sensed memory cell (S120). In one example, when the first memory cell is sensed to be in the first program state, a string selection transistor is turned off by disabling the string selection line connected to the first memory cell, and a voltage of the bit line is not applied to a cell string including the first memory cell.

In an embodiment where the memory cell array is a vertically stacked memory cell array, the string selection line may be either the upper selection line USL or the lower selection line LSL described above with reference to FIGS. 8 to 13. In an embodiment in which the memory cell array is a cross-point memory cell array, the string selection line may refer to a signal line for disabling a row including the selected memory cell.

The memory device 100 senses a second program state by applying a second voltage to the bit line BL (S130). According to an exemplary embodiment of the inventive concept, the memory device 100 applies a plurality of read voltages to the bit line to sense a plurality of program states and disables the string selection line corresponding to the memory cell that determines the program state, and thus, it is possible to prevent the program state from being determined in duplicate. For example, the bit line may be connected to a cell string including a first memory cell connected to a first word line and a second memory cell connected to a second word line, where the first memory cell is sensed to be in the first program state due to application of the first voltage to the bit line during step S110; the string selection line of the first memory cell is disabled during step S120 since the first memory cell has the first program state, the string selection line of the second memory cell remains enabled, and then the second memory cell is sensed to be in a second other program state due to application of the second other voltage to the same bit line during step S130.

Figure 16:
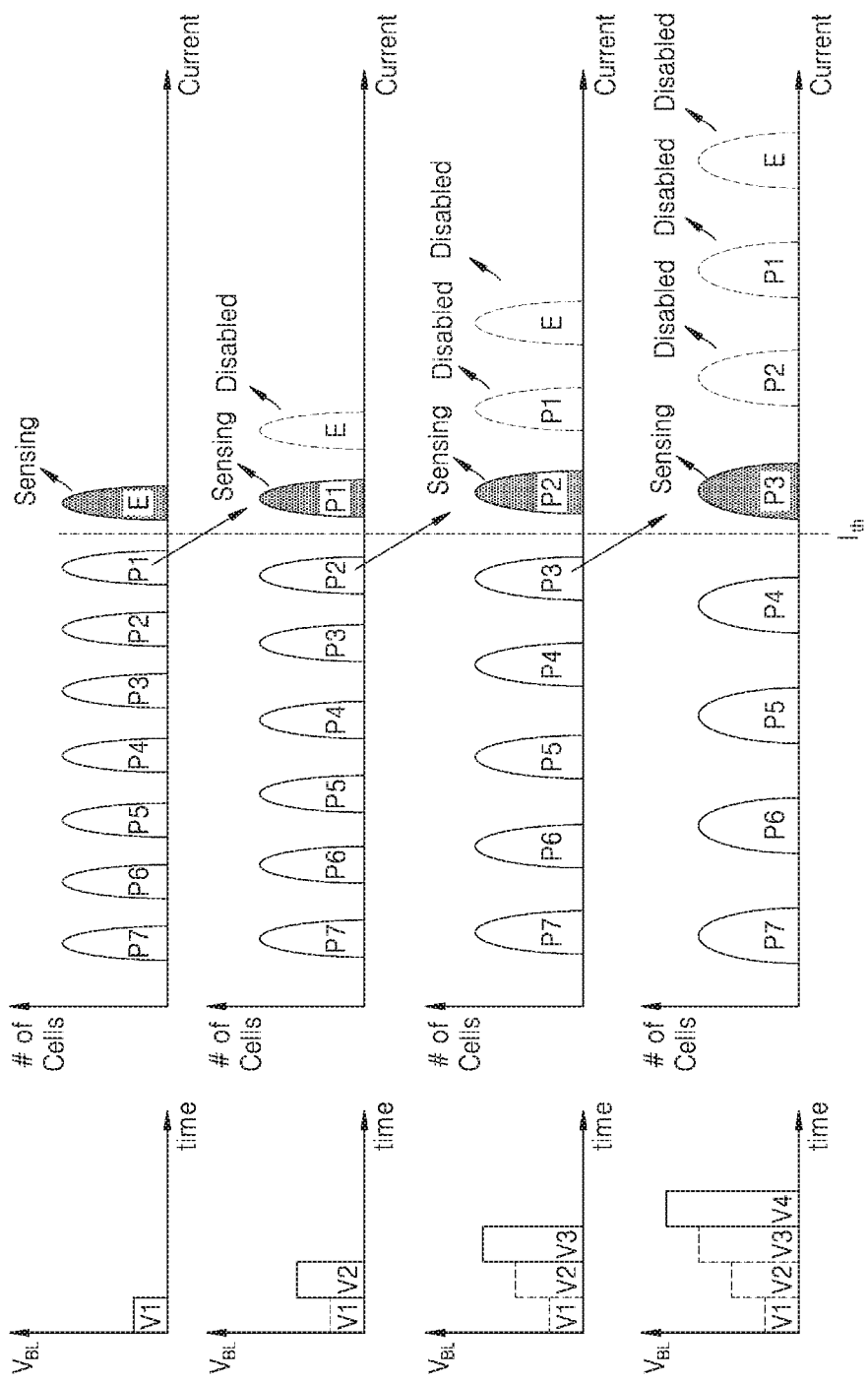
FIG. 16 is a diagram illustrating a method of determining a program state of a memory cell, according to an exemplary embodiment of the inventive concept.

FIG. 16 is a diagram illustrating a method of determining the program state of the memory cell, according to an exemplary embodiment of the inventive concept.

Referring to FIGS. 2 and 16, the memory cells included in the memory cell array 110 may have a resistance value corresponding to any one of an erase state E and a first program state P1 to a seventh program state P7. In one example, the plurality of memory cells may be programmed such that the resistance value corresponding to the erase state E is smallest and the resistance value corresponding to the seventh program state P7 is largest.

First, the read manager 120 applies a first voltage V1 to the bit line BL by controlling the voltage generator 130. Accordingly, an output current may be generated from each of the cell strings included in the memory cell array 110, and the output current corresponding to each of the plurality of memory cells may have a value inversely proportional to the resistance value programmed according to Ohm's Law.

Since the first voltage V1 is applied to the bit line BL, the output current corresponding to any one of the erase state E and the first program state P1 to the seventh program state P7 may be generated from the memory cells, and the output current corresponding to the erase state E having the lowest resistance value among the resistance values have a value of a current greater than a reference current Ith.

The read manager 120 determines memory cells having the value of the current greater than the reference current Ith by comparing the output current from the plurality of memory cells with the reference current Ith, and determines the memory cells to be in the erase state E. The read manager 120 outputs a string selection line deactivation signal Sig_DS for deactivating the string selection line corresponding to the memory cells determined to be in the erase state E, and accordingly, the cell string including the memory cells determined to be in the erase state E are deactivated.

Next, the read manager 120 applies a second voltage V2 having a voltage level that is higher than the first voltage V1 to the bit line BL by controlling the voltage generator 130. Since the cell string including the memory cells corresponding to the erase state E is deactivated, an output current corresponding to any one of the first program state P1 to the seventh program state P7 may be generated from the memory cells. Only the output current corresponding to the first program state P1 having the lowest resistance value among the first program state P1 to the seventh program state P7 may have a value of the current greater than the reference current Ith.

The read manager 120 determines the memory cells having the value of the current greater than the reference current Ith by comparing the output current from the plurality of memory cells with the reference current Ith, and the memory cells are determined to be in the first program state P1. The read manager 120 outputs a string selection line deactivation signal Sig_DS for deactivating the string selection line corresponding to the memory cells determined to be in the first program state P1, and accordingly, the cell string including the memory cells determined according to the first program state P1 are deactivated.

Next, the read manager 120 applies a third voltage V3 having a voltage level that is higher than the second voltage V2 to the bit line BL by controlling the voltage generator 130. Since the cell string including the memory cells corresponding to the erase state E and the first program state P1 is deactivated, the output current corresponding to any one of the second program state P2 to the seventh program state P7 may be generated from the memory cells. Only the output current corresponding to the second program state P2 having the lowest resistance value among the second program state P2 to the seventh program state P7 may have a value of the current greater than the reference current Ith.

The read manager 120 determines the memory cells having the value of the current greater than the reference current Ith by comparing the output current from the plurality of memory cells with the reference current Ith, and the memory cells are determined to be in the program state P2. The read manager 120 outputs the string selection line deactivation signal Sig_DS for deactivating the string selection line corresponding to the memory cells determined to be in the second program state P2, and accordingly, the cell string including the memory cells determined to be in the second program state P2 are deactivated.

The memory device 100 may determine the third program state P3 to the seventh program state P7 in a method similar to the method described above, and the determined program state may be output to an external device (for example, the memory controller 200 of FIG. 1) as data DATA.

The memory device 100 according to an exemplary embodiment of the inventive concept sequentially applies the plurality of read voltages V1 to V4 to the bit line BL, compares the output current with the reference current Ith, thereby, determining a program state for the memory cells, and a plurality of program states may be determined with only one reference current Ith.

In FIG. 16, an embodiment of determining eight program states (the erase state E to the seventh program state P7) is illustrated, but the inventive concept may also be applied to a case where program states more than or less than eight program states are determined.

Figure 17:
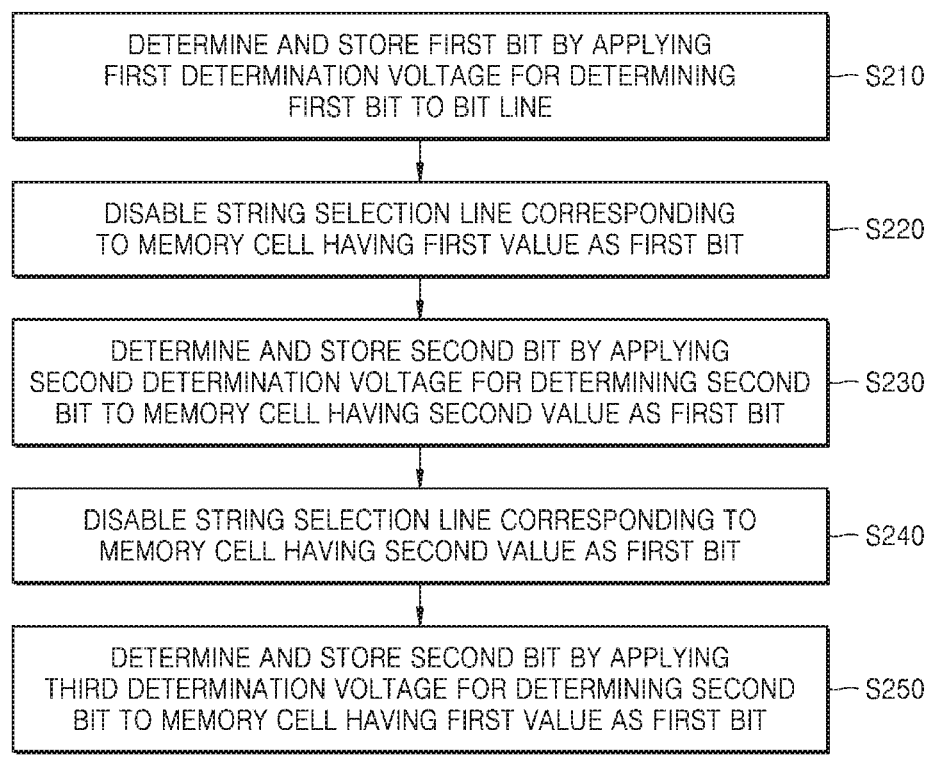
FIG. 17 is a flowchart illustrating a method of operating a memory device, according to an exemplary embodiment of the inventive concept.

FIG. 17 is a flowchart illustrating a method of operating a memory device, according to an exemplary embodiment of the inventive concept.

Referring to FIGS. 2 and 17, the memory device 100 determines a first bit by applying a first determination voltage for determining the first bit to the bit line BL and stores the first bit in the first latch LAT1 (S210). In one example, the memory device 100 compares an output current generated from memory cells with a reference current by applying the first determination voltage to the bit line BL to generate a comparison result and stores "0" or "1" in the first latch LAT1 based on the comparison result.

The memory device 100 disables a string selection line corresponding to the memory cell having a first value as the first bit (S220). In one example, the memory device 100 disables the string selection line corresponding to the memory cells having "0" as the first bit, and thus, a voltage applied to the bit line BL is not applied to the memory cells having "0" as the first bit.

The memory device 100 determines a second bit of the memory cells having a second value as the first bit by applying a second determination voltage for determining the second bit to the bit line BL and stores the second bit in the second latch LAT2 (S230). In one example, the memory device 100 compares an output current generated from memory cells having the second value as the first bit with the reference current by applying the second determination voltage to the bit line BL to generate a comparison result and stores "0" or "1" in the second latch LAT2 based on the comparison result.

The memory device 100 disables a string selection line corresponding to the memory cell having the second value as the first bit (S240). In one example, the memory device 100 disables the string selection line corresponding to the memory cells having "1" as the first bit, and thus, the voltage applied to the bit line BL is not applied to the memory cells having "1" as the first bit.

The memory device 100 determines the second bit of the memory cells having the first value as the first bit by applying a third determination voltage for determining the second bit to the bit line BL and stores the second bit in the second latch LAT2 (S250). In one example, the memory device 100 compares an output current generated from the memory cells having the first value as the first bit with the reference current by applying the third determination voltage to the bit line BL to generate a comparison result and stores "0" or "1" in the second latch LAT2 based on the comparison result.

The memory device 100 according to an exemplary embodiment of the inventive concept applies a plurality of determination voltages to a bit line and disables a memory cell in which a determination has completed for each bit, thereby enabling an efficient program state determination.

Figure 18A:
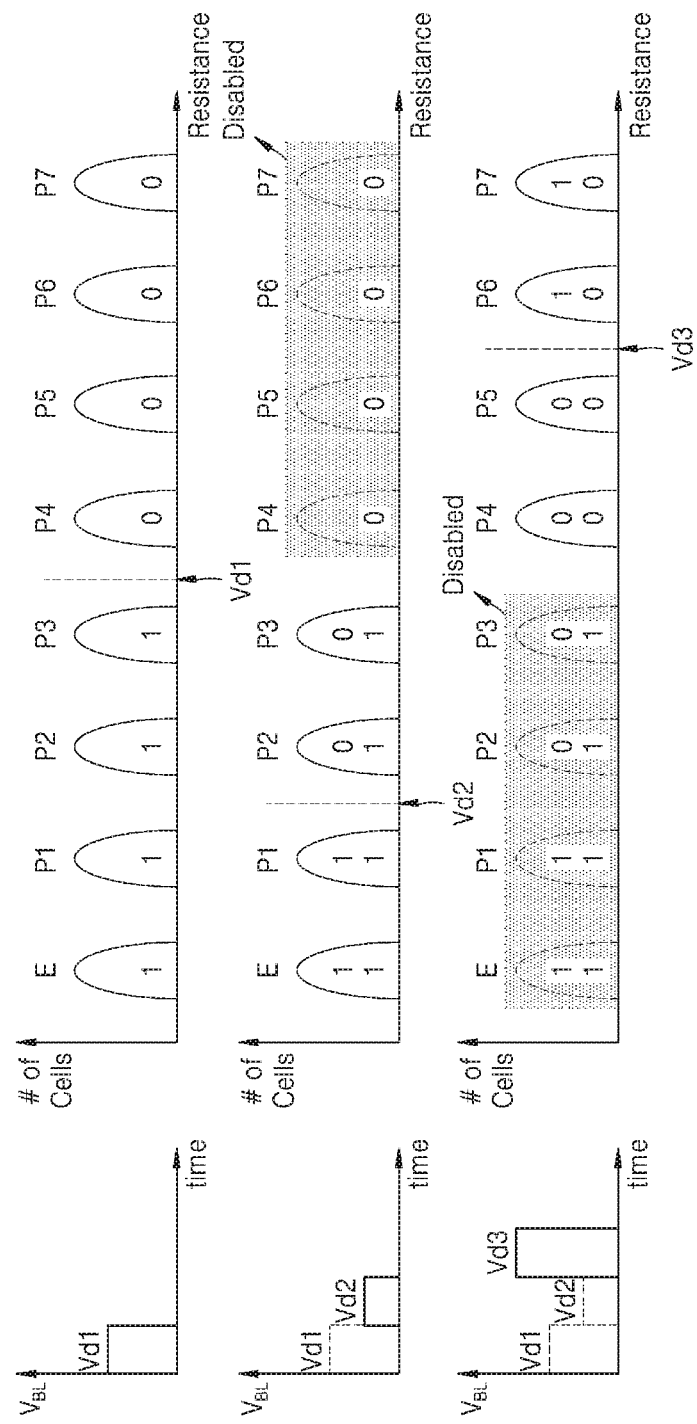
FIGS. 18A and 18B illustrate a method of determining a program state of a memory cell, according to an exemplary embodiment of the inventive concept.
Figure 18B:
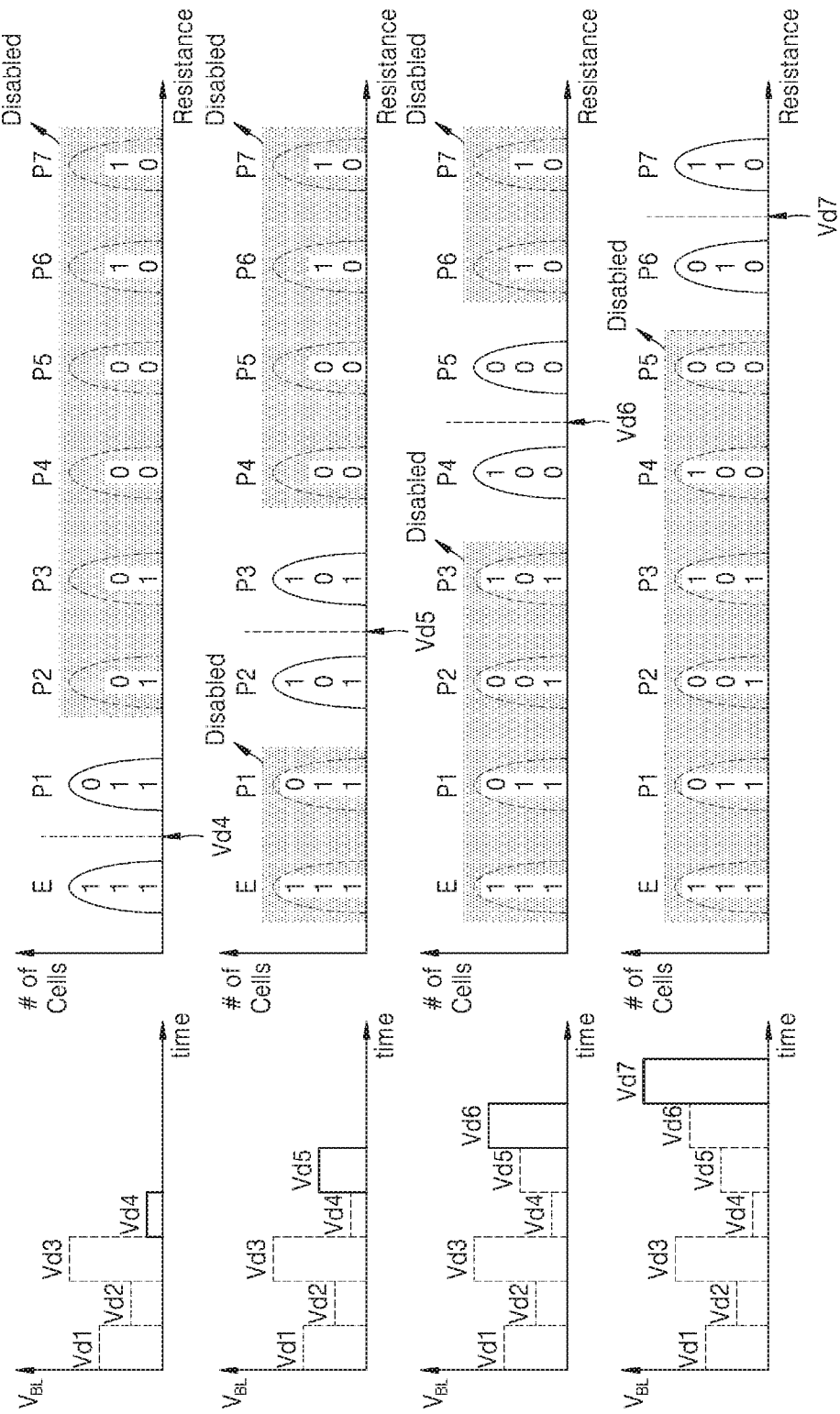

FIGS. 18A and 18B illustrate a method of determining a program state of a memory cell according to an exemplary embodiment of the inventive concept.

Referring to FIGS. 2 and 18A, memory cells included in the memory cell array 110 may have resistance values corresponding to one of the erase state E and the first program state P1 to the seventh program state P7. In one example, the plurality of memory cells may be programmed such that a resistance value corresponding to the erase state E is smallest and a resistance value corresponding to the seventh program state P7 is largest.

First, the read manager 120 applies a first determination voltage Vd1 to the bit line BL by controlling the voltage generator 130. In one embodiment, the first determination voltage Vd1 has a previously determined voltage level that distinguishes a resistance value corresponding to the erase state E to the third program state P3 and a resistance value corresponding to the fourth program state P4 to the seventh program state P7.

Since the first determination voltage Vd1 is applied to the bit line BL, an output current corresponding to any one of the erase state E and the first program state P1 to the seventh program state P7 from the memory cells may be generated, and the read manager 120 determines the first bit by comparing the output current with the reference current. In response to the first determination voltage Vd1, the memory cell having the erase state E to the third program state P3 generates an output current having a value of a current greater than the reference current, and the memory cells having the fourth program state P4 to the seventh program states P7 generates an output current having a value of a current less than the reference current.

The read manager 120 may control the read-out circuit 160 based on the comparison result, thereby, writing "1" to the first latch LAT1 corresponding to the memory cell having the erase state E to the third program state P3 as the first bit, and writing "0" to the first latch LAT1 corresponding to the memory cell having the fourth program state P4 to the seventh program state P7 as the first bit.

The read manager 120 disables the string selection line corresponding to the memory cell having "0", that is, the memory cell having the fourth program state P4 to the seventh program state P7 as the first bit by controlling the row decoder 140.

The read manager 120 applies a second determination voltage Vd2 to the bit line BL. In an exemplary embodiment, the second determination voltage Vd2 has a previously determined voltage level that distinguishes a resistance value corresponding to the erase state E and the first program state P1 and a resistance value corresponding to the second program state P2 to the third program state P3. Since the string selection line corresponding to the memory cells having the fourth program state P4 to the seventh program state P7 are disabled, the second determination voltage Vd2 is applied to the memory cell having "1", that is, the memory cell having the erase state E to the third program states P3 as the first bit.

Accordingly, an output current corresponding to any one of the erase state E to the third program state P3 may be generated from the memory cells, and the read manager 120 compares the output current with the reference current to determine the second bit. In response to the second determination voltage Vd2, the memory cell having the erase state E and the first program state P1 generates an output current having a value of a current greater than the reference current, and the memory cell having the second program state P2 and the third program state P3 generates an output current having a value of a current less than the reference current.

The read manager 120 may control the read-out circuit 160 based on the comparison result, thereby, writing "1" to the second latch LAT2 corresponding to the memory cell having the erase state E and the first program state P1 as the second bit, and writing "0" to the second latch LAT2 corresponding to the memory cell having the second program state P2 to the third program state P3 as the second bit.

The read manager 120 disables the string selection line corresponding to the memory cell having "1", that is, the memory cell having the erase state E to the third program state P3 as the first bit by controlling the row decoder 140.

The read manager 120 applies a third determination voltage Vd3 to the bit line BL. According to an exemplary embodiment, the third determination voltage Vd3 has a previously determined voltage level that can distinguish a resistance value corresponding to the fourth program state P4 and the fifth program state P5 and a resistance value corresponding to the sixth program state P6 and the seventh program state P7. Since the string selection line corresponding to the memory cells having the erase state E to the third program state P3 is disabled, the third determination voltage Vd3 may be applied to the memory cells having "0", that is, the memory cell having the fourth program state P4 to the seventh program state P7 as the first bit.

Accordingly, an output current corresponding to any one of the fourth program state P4 to the seventh program state P7 may be generated from the memory cells, and the read manager 120 may compare the output current with the reference current to determine the second bit. In response to the third determination voltage Vd3, the memory cell having the fourth program state P4 and the fifth program state P5 generates an output current having a value of a current greater than the reference current, and the memory cell having the program state P6 and the seventh program state P7 generates an output current having a value of a current less than the reference current.

The read manager 120 may control the read-out circuit 160 based on the comparison result, thereby, writing "0" to the second latch LAT2 corresponding to the memory cell having the fourth program state P4 and the fifth program state P5 as the second bit, and writing "1" to the second latch LAT2 corresponding to the memory cell having the sixth program states P6 and the seventh program state P7 as the second bit.

Referring to FIGS. 2 and 18B, the read manager 120 disables the string selection line corresponding to the memory cell having the second program state P2 to the seventh program state P7 by controlling the row decoder 140.

The read manager 120 applies a fourth determination voltage Vd4 to the bit line BL. In an exemplary embodiment, the fourth determination voltage Vd4 has a previously determined voltage level that distinguishes a resistance value corresponding to the erase state E and a resistance value corresponding to the first program state P1. Since the string selection line corresponding to the memory cells having the second program state P2 to the seventh program state P7 is disabled, the fourth determination voltages Vd4 may be applied to the memory cells having the erase state E and the first program state P1.

Accordingly, an output current corresponding to any one of the erase state E and the first program state P1 may be generated from the memory cells, and the read manager 120 may compare the output current with the reference current to generate a third bit. In response to the fourth determination voltage Vd4, the memory cell having the erase state E generates an output current having a value of a current value greater than the reference current, and the memory cell having the first program state P1 generates an output current having a value of a current value less than the reference current.

The read manager 120 may control the read-out circuit 160 based on the comparison result, thereby, writing "1" to the third latch LAT3 corresponding to the memory cell having the erase state E as the third bit, and writing "0" to the third latch LAT3 corresponding to the memory cell having the first program state P1 as the third bit.

The read manager 120 applies a plurality of determination voltages Vd5 to Vd7 to determine a third bit corresponding to the second program state P2 to the seventh program state P7 in a method similar to the method of determining the third bit for the erase state E and the first program state P1 and to store the third bit to the third latch LAT3. The read manager 120 may output the data DATA based on a plurality of determined bits.

The memory device 100 according to an exemplary embodiment of the inventive concept efficiently reads data by determining a plurality of bits using a plurality of determination voltages and by distinguishing the program states with the plurality of bits.

Although FIGS. 18A and 18B illustrate an embodiment using eight program states (the erase state E to the seventh program state P7), the inventive concept is not limited thereto and may be applied to a case where program states more than or less than the eight program states are determined.

Figure 19A:
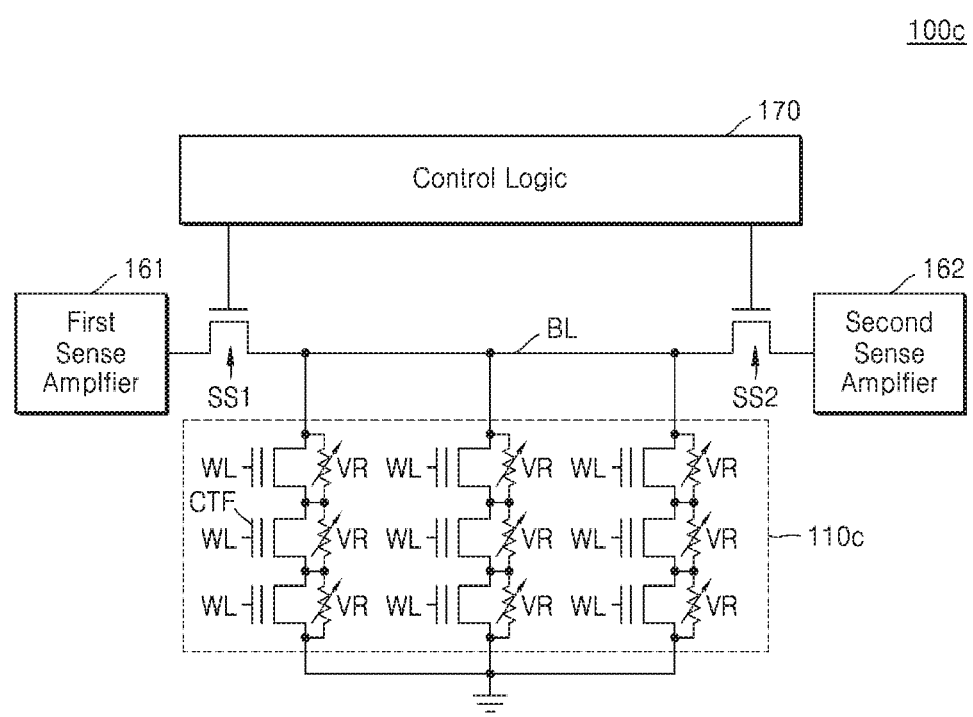
FIGS. 19A and 19B are diagrams illustrating a memory device according to an exemplary embodiment of the inventive concept.
Figure 19B:
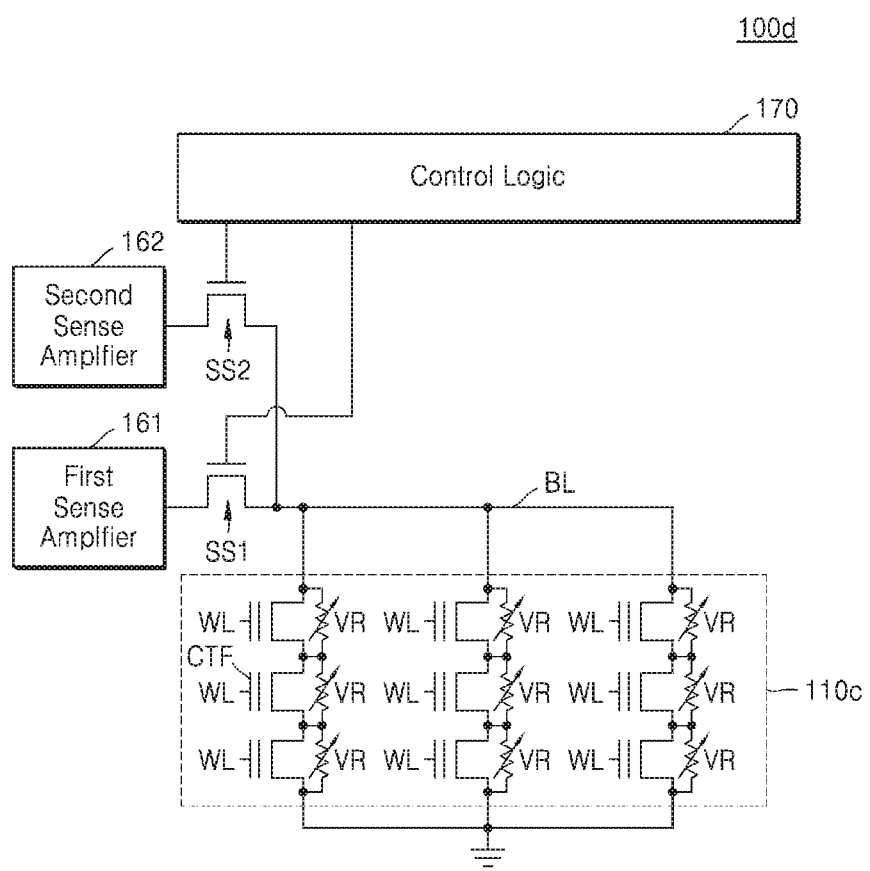

FIGS. 19A and 19B are diagrams illustrating memory devices according to exemplary embodiments of the inventive concept. Specifically, FIGS. 19A and 19B illustrate embodiments in which the memory device includes a merged memory cell array.

Referring to FIG. 19A, a memory device 100c includes a memory cell array 110c, a first sense amplifier 161, a second sense amplifier 162, and the control logic 170.

The memory cell array 110c may include the plurality of merged memory cells described above with reference to FIGS. 11 to 14. As described above, the plurality of merged memory cells may store first data by using the variable resistance element VR and store second data by using the charge trap layer CTF.

The first sense amplifier 161 senses and amplifies first data stored in the variable resistance element VR and outputs the amplified data. The first sense amplifier 161 is connected to one terminal of the bit line BL through a first sense switch SS1, and the first sense switch SS1 may be turned on or off by the control logic 170. For example, when the first sense switch SS1 is a transistor, a gate terminal of the transistor may receive a control signal from the control logic 170 to turn on or off the first sense switch SS1. According to an exemplary embodiment, the control logic 170 connects the first sense amplifier 161 to the bit line BL by turning on the first sense switch SS1, and the first sense amplifier 161 senses the first data from the memory cell array 110c through the bit line BL.

The second sense amplifier 162 senses and amplifies the second data stored in the charge trap layer CTF and outputs the amplified data. The second sense amplifier 162 is connected to the other terminal of the bit line BL through a second sense switch SS2, and the second sense switch SS2 may be turned on or off by the control logic 170. According to an exemplary embodiment, the control logic 170 connects the second sense amplifier 162 to the bit line BL by turning on the second sense switch SS2, and the second sense amplifier 162 senses second data from the memory cell array 110c through the bit line BL.

The first sense switch SS1 and the second sense switch SS2 may include switching elements capable of electrically connecting or disconnecting the bit line BL and the sense amplifiers 161 and 162. In one example, the first sense switch SS1 and the second sense switch SS2 may each include an N-type metal oxide semiconductor (NMOS) transistor or a p-type metal oxide semiconductor (PMOS) transistor.

Referring to FIG. 19B, a memory device 100d includes the memory cell array 110c, the first sense amplifier 161, the second sense amplifier 162, and the control logic 170. The memory device 100d includes the first sense amplifier 161 and the second sense amplifier 162 simultaneously connected to one terminal of the bit line BL, unlike the memory device 100c illustrated in FIG. 19A. Configurations other than the configurations described above may be the same as or similar to the configurations of the memory device 100c of FIG. 19A.

The memory devices 100c and 100d according to exemplary embodiments of the inventive concept may efficiently manage a large quantity of data using limited resources by extracting data from the merged memory cell array 110c by using different sense amplifiers.

Figure 20:
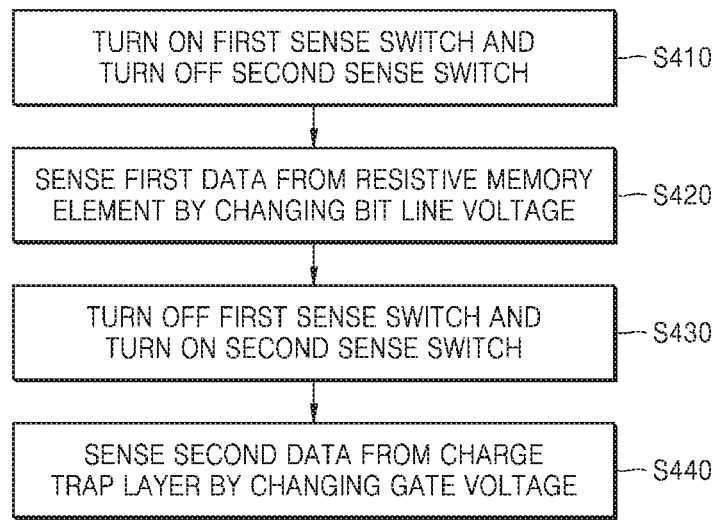
FIG. 20 is a flowchart illustrating a method of operating a control logic, according to an exemplary embodiment of the inventive concept.

FIG. 20 is a flowchart illustrating a method of operating a control logic according to an exemplary embodiment of the inventive concept. In detail, FIG. 20 illustrates a method of extracting data from a merged memory cell array.

Referring to FIG. 19A, FIG. 19B, and FIG. 20, the control logic 170 turns on the first sense switch SS1 and turns off the second sense switch SS2 (S410). According to the embodiment, the control logic 170 is connected to gate terminals of the first sense switch SS1 and the second sense switch SS2, applies a turn-on voltage to the first sense switch (SS1), and applies a turn-off voltage to the second sense switch SS2.

The control logic 170 varies the bit line voltage by controlling the voltage generator 130 of FIG. 2, senses the first data from the resistive memory element VR by controlling the first sense amplifier 161, amplifies the first data, and outputs the amplified first data (S420). According to an exemplary embodiment, the control logic 170 senses the first data from the resistive memory element VR by using the method described above with reference to FIGS. 1 to 18.

After sensing of the first data has completed, the control logic 170 turns off the first sense switch SS1 and turns on the second sense switch SS2 (S430). According to an exemplary embodiment, a turn-off voltage is applied to the first sense switch SS1 and a turn-on voltage is applied to the second sense switch SS2.

The control logic 170 controls the voltage generators 130 of FIG. 2 to vary a gate voltage of a memory cell included in the memory cell array 110c through the word line WL and controls the second sense amplifier 162 to sense the second data from the charge trap layer CTF, to amplify the second data, and to output the amplified second data (S440).

Figure 21:
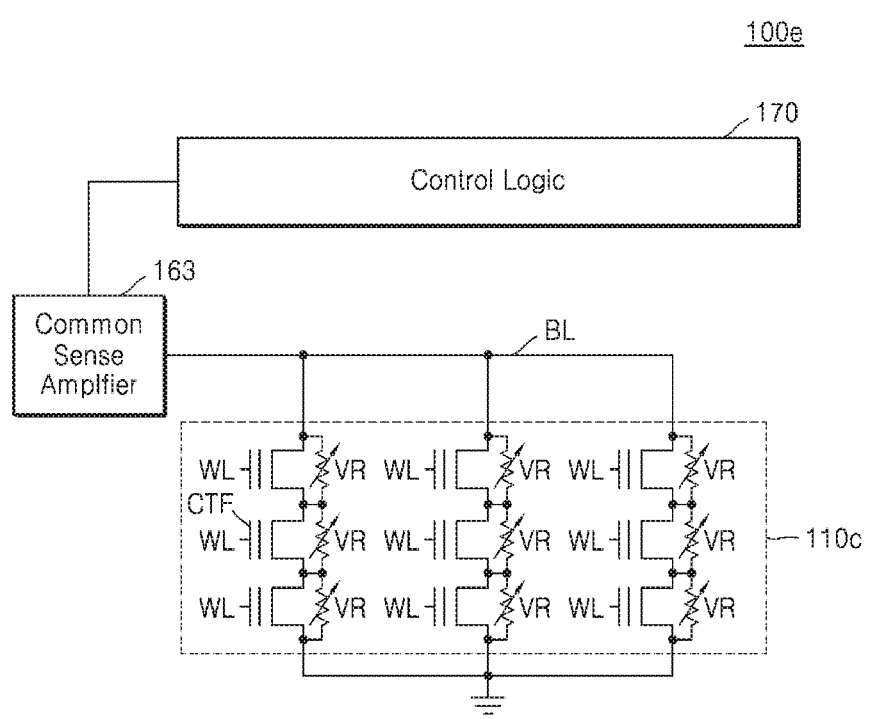
FIG. 21 is a diagram illustrating a memory device according to an exemplary embodiment of the inventive concept.

FIG. 21 is a diagram illustrating a memory device according to an exemplary embodiment of the inventive concept. In detail, FIG. 21 illustrates an embodiment in which a memory device includes a merged memory cell array. Descriptions already given above with reference to FIGS. 19A and 19B are omitted.

Referring to FIG. 21, a memory device 100e includes the memory cell array 110c, a common sense amplifier 163, and the control logic 170.

The common sense amplifier 163 senses and amplifies the first data stored in the variable resistance element VR or the second data stored in the charge trap layer CTF, and outputs the amplified data, based on the control of the control logic 170.

The control logic 170 may sense the first data from the resistive memory cell VR by controlling the common sense amplifier 163 at a first time point, and senses the second data from the charge trap layer CTF by controlling the common sense amplifier 162 at a second time point.

The memory device 100e according to an exemplary embodiment of the inventive concept may efficiently manage a large quantity of data using limited resources by extracting the first data and the second data from the merged memory cell array 110c by using the common sense amplifier 163 at different time points.

Figure 22:
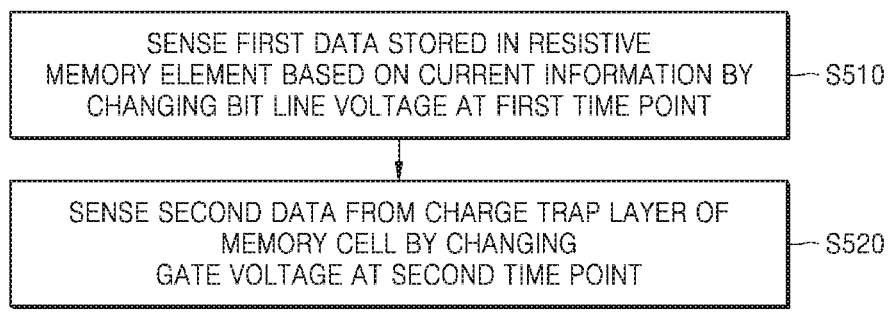
FIG. 22 is a flowchart illustrating a method of operating a control logic, according to an exemplary embodiment of the inventive concept.

FIG. 22 is a flowchart illustrating a method of operating a control logic according to an exemplary embodiment of the inventive concept. In detail, FIG. 22 illustrates a method of extracting data from a merged memory cell array.

Referring to FIGS. 21 and 22, the control logic 170 controls the voltage generator 130 of FIG. 2 at a first time point to vary a bit line voltage, and controls the common sense amplifier 163 to sense the first data from the resistive memory element VR, amplifies the first data, and outputs the amplified first data (S510). According to an exemplary embodiment, the control logic 170 senses the first data from the resistive memory element VR by using the method described above with reference to FIGS. 1 to 18.

After sensing of the first data has completed, the control logic 170 controls the voltage generator 130 of FIG. 2 at a second time point to vary a gate voltage of a memory cell included in the memory cell array 110c through the word line WL, controls the common sense amplifier 162 to sense second data from the charge trap layer CTF, amplifies the second data, and outputs the amplified second data (S520).

Figure 23:
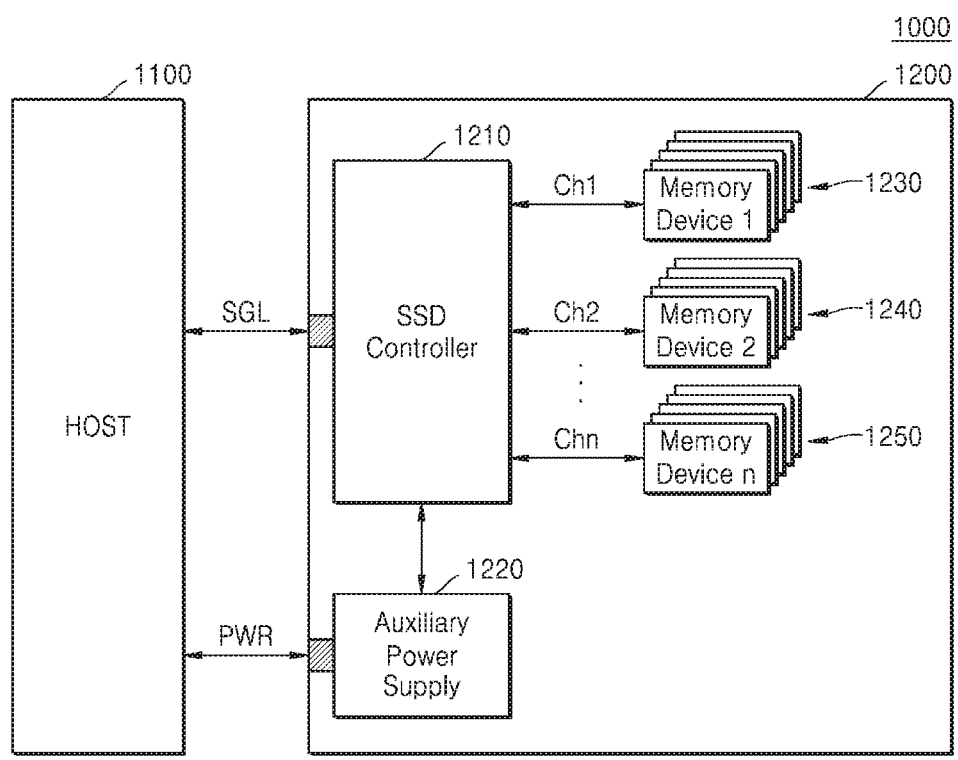
FIG. 23 is a block diagram illustrating an example in which a memory device according to an exemplary embodiment of the inventive concept is applied to a solid state drive (SSD) system.

FIG. 23 is a block diagram illustrating an example in which the memory device according to an exemplary embodiment of the inventive concept is applied to an SSD system.

Referring to FIG. 23, an SSD system 1000 includes a host 1100 and an SSD 1200. The SSD 1200 exchanges signals with the host 1100 through a signal connector and receives power through a power connector. The SSD 1200 may include an SSD controller 1210, an auxiliary power supply 1220, and a plurality of nonvolatile memory devices 1230, 1240, and 1250. At least one of the plurality of nonvolatile memory devices 1230, 1240, and 1250 may be a resistive memory device, and the memory device according to the above-described embodiments of the inventive concept may be applied to one or more of the plurality of nonvolatile memory devices 1230, 1240, and 1250.

The SSD controller 1210 may be connected to the plurality of memory devices 1230, 1240, and 1250 through a plurality of channels Ch1 to Chn and store data in the plurality of memory devices 1230, 1240 and 1250 or read data from the plurality of memory devices 1230, 1240, and 1250.

While the inventive concept has been particularly illustrated and described with reference to embodiments thereof, it will be understood that various changes in form and details may be made therein without departing from the spirit and scope of the inventive concept.

What is claimed is:

1. A resistive memory device comprising:
a memory cell array including a plurality of memory cells connected to a plurality of bit lines, wherein each memory cell includes a variable resistance element to store data;
a control logic configured to receive a read command and to generate a voltage control signal for generating a plurality of read voltages, based on the read command;
a voltage generator configured to sequentially apply the plurality of read voltages to the plurality of bit lines, based on the voltage control signal; and
a read-out circuit connected to the bit lines, wherein the control logic determines values of data stored in the plurality of memory cells by controlling the read-out circuit to sequentially compare values of currents sequentially output from the plurality of memory cells in response to the plurality of read voltages with a value of a reference current.

2. The resistive memory device of claim 1, wherein the memory cell array comprises:
an active pillar having a hollow structure;
a variable resistance film disposed in contact with a first side of the active pillar, wherein a resistance of the variable resistance film is configured to change based on oxidation and reduction reactions; and
a three-dimensional cell array structure including a gate disposed adjacent to a second side of the active pillar different from the first side.

3. The resistive memory device of claim 1, wherein each of the plurality of memory cells has any one of first to Nth resistance values respectively corresponding to different program states, and wherein the control logic generates the voltage control signal for determining the first resistance value to the Nth resistance value, where N is a natural number greater than or equal to 2.

4. The resistive memory device of claim 3, wherein the control logic sequentially applies ascending first to N−1th voltages to the plurality of bit lines by controlling the voltage generator, and wherein the read-out circuit determines program states for the plurality of memory cells, based on values of currents output from the plurality of memory cells according to the first to N−1th voltages based on a control of the control logic.

5. The resistive memory device of claim 4, wherein the read-out circuit determines the program states of the memory cells by sequentially comparing the values of the currents output from the plurality of memory cells according to the value of the reference current and the first to N−1th voltages.

6. The resistive memory device of claim 4, wherein the control logic deactivates a string selection line corresponding to a memory cell in which a determination of the program states has completed.

7. The resistive memory device of claim 4, wherein the control logic applies an M-th voltage for determining an Mth resistance value to the plurality of bit lines by controlling the voltage generator, determines the memory cells having the Mth resistance value by comparing the value of the reference current with the values of the currents output from the plurality of memory cells by controlling the read-out circuit, and disables a string selection line corresponding to the memory cells having the Mth resistance value, where M is a natural number less than N and greater than or equal to 1.

8. The resistive memory device of claim 7, wherein the memory cell array includes a cross-point cell array including a plurality of resistive memory cells arranged at positions where the plurality of bit lines and a plurality of word lines cross each other.

9. The resistive memory device of claim 3, wherein program states of the plurality of memory cells include a plurality of bits, and wherein the control logic applies a first determination voltage for determining a first bit of a plurality of first memory cells among the plurality of memory cells to the plurality of bit lines by controlling the voltage generator.

10. The resistive memory device of claim 9, wherein the control logic deactivates a string selection line corresponding to the plurality of first memory cells having a first value as the first bit, and applies a second determination voltage for determining a second bit of a plurality of second memory cells among the memory cells having a second value as the first bit to the plurality of bit lines by controlling the voltage generator.

11. The resistive memory device of claim 10, wherein the control logic determines the second bit of the plurality of second memory cells and thereafter deactivates a string selection line corresponding to the plurality of second memory cells, and applies a third determination voltage for determining a second bit of the plurality of first memory cells to the plurality of bit lines by controlling the voltage generator.

12. The resistive memory device of claim 9, wherein the read-out circuit comprises a first latch for storing the first bit and a second latch for storing a second bit, and wherein the control logic stores the first bit in the first latch after completion of determination of the first bit, deactivates a string selection line corresponding to the plurality of first memory cells having a first value as the first bit, and applies a second determination voltage for determining a second bit of a plurality of second memory cells among the memory cells having a second value as the first bit to the plurality of bit lines by controlling the voltage generator.

13. The resistive memory device of claim 12, wherein the control logic stores the second bit in the second latch after determining the second bit of the plurality of second memory cells, and turns off a string selection transistor corresponding to the plurality of second memory cells after determining the second bit of the plurality of second memory cells, and applies a third determination voltage for determining a second bit of the plurality of first memory cells to the plurality of bit lines by controlling the voltage generator.

14. The resistive memory device of claim 1, wherein the memory cell array comprises a plurality of merged memory cells including a resistive memory element and a charge trap layer, and wherein the read-out circuit comprises a first sense amplifier configured to determine a first program state of the resistive memory element included in each of the plurality of merged memory cells and a second sense amplifier configured to determine a second program state for the charge trap layer included in each of the plurality of merged memory cells.

15. The resistive memory device of claim 14, wherein the read-out circuit further comprises a first sense switch that connects or disconnects the first sense amplifier and the plurality of bit lines, and a second sense switch that connects or disconnects the second sense amplifier and the plurality of bit lines, and wherein the control logic determines the first program state by turning on the first sense switch and turning off the second sense switch and determines the second program state by turning off the first sense switch and turning on the second sense switch.

16. The resistive memory device of claim 1, wherein the memory cell array comprises a plurality of merged memory cells including a resistive memory element and a charge trap layer, wherein the read-out circuit comprises a sense amplifier that determines a first program state for the resistive memory element included in each of the plurality of merged memory cells and a second program state for the charge trap layer included in each of the plurality of merged memory cells, and wherein the control logic determines the first program state by controlling the sense amplifier at a first time point and determines the second program state by controlling the sense amplifier at a second time point.

17. A method of operating a resistive memory device, the method comprising:
- applying a first voltage to a plurality of bit lines of the resistive memory device;
- sensing a first current from a memory cell array of the resistive memory device in response to the first voltage;
- determining first memory cells of the memory cell array having a first program state in response to the first voltage by comparing the first sensed current with a reference current;
- applying a second voltage to the plurality of bit lines, the second voltage being different from the first voltage;
- sensing a second current from the memory cell array in response to the second voltage; and
- determining second memory cells of the memory cell array having a second program state in response to the second voltage by comparing the second sensed current with the reference current in response to the second voltage.

18. The method of claim 17, further comprising deactivating a string selection line corresponding to the first memory cells after determining the first memory cells.

19. The method of claim 17, wherein the first memory cells have a first value as a first bit representing the first program state, and wherein the method further comprises:
- storing the first value in a first latch corresponding to the first bit of the first memory cells; and
- storing a second value in a second latch corresponding to a first bit of remaining cells of the memory cell array other than the first memory cells.

20. A resistive memory device comprising:
- a memory cell array including a plurality of merged memory cells each including a resistive memory element and a charge trap layer;
- a control logic that receives a read command and generates a voltage control signal for generating a plurality of read voltages based on the read command;
- a voltage generator configured to sequentially apply the plurality of read voltages to a plurality of bit lines connected to the merged memory cells based on the voltage control signal, and to apply a gate voltage to the charge trap layer; and
- a read-out circuit including a first sense amplifier configured to determine a first program state for the resistive memory element and a second sense amplifier configured to determine a second program state for the charge trap layer.

* * * * *